United States Patent
Yoshida

(10) Patent No.: US 11,537,012 B2
(45) Date of Patent: Dec. 27, 2022

(54) SUBSTRATE FOR DISPLAY DEVICE AND DISPLAY DEVICE

(71) Applicant: Sharp Kabushiki Kaisha, Sakai (JP)

(72) Inventor: Masahiro Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 157 days.

(21) Appl. No.: 17/137,507

(22) Filed: Dec. 30, 2020

(65) Prior Publication Data

US 2021/0217779 A1     Jul. 15, 2021

Related U.S. Application Data

(60) Provisional application No. 62/961,266, filed on Jan. 15, 2020.

(51) Int. Cl.
    *G02F 1/1345*      (2006.01)
    *H01L 27/12*      (2006.01)

(52) U.S. Cl.
    CPC ........ *G02F 1/13452* (2013.01); *G02F 1/1345* (2013.01); *G02F 1/13454* (2013.01); *H01L 27/1244* (2013.01); *H01L 27/1255* (2013.01)

(58) Field of Classification Search
    CPC .............. G02F 1/13454; G02F 1/1345; G02F 1/13452–13458
See application file for complete search history.

(56) References Cited

U.S. PATENT DOCUMENTS

| | | | |
|---|---|---|---|
| 10,262,606 B2 * | 4/2019 | Shima | .................... G02F 1/1362 |
| 2016/0190166 A1 * | 6/2016 | Kim | ..................... G09G 3/3233 |
| | | | 257/71 |
| 2017/0221435 A1 | 8/2017 | Shima | |

FOREIGN PATENT DOCUMENTS

JP      2017-134338 A      8/2017

* cited by examiner

*Primary Examiner* — Dung T Nguyen
(74) *Attorney, Agent, or Firm* — Keating & Bennett, LLP

(57) ABSTRACT

A substrate for a display device, the substrate includes a signal supply section that supplies a signal; a substrate section having an extended outer shape section and having a display area configured to display an image; a plurality of lead wires that extend along the extended outer shape section to the display area; and a circuit section that is placed so that the lead wires are interposed between the display area and the circuit section and that is composed of a plurality of unit circuits arranged along the extended outer shape section, wherein the plurality of unit circuits include a unit circuit having an extension section that extends away from the signal supply section so as to be interposed between a unit circuit that is adjacent to the unit circuit on a side opposite to the signal supply section and the lead wires.

15 Claims, 21 Drawing Sheets

SUBSTRATE FOR DISPLAY DEVICE AND DISPLAY DEVICE

CROSS-REFERENCE TO RELATED APPLICATION

The present application claims priority from Provisional Application No. 62/961,266, the content to which is hereby incorporated by reference into this application.

BACKGROUND OF THE INVENTION

1. Field of the Invention

The technology disclosed herein relates to a substrate for a display device and a display device.

2. Description of the Related Art

A known example of a conventional display device is described in Japanese Unexamined Patent Application Publication No. 2017-134338. The display device described in Japanese Unexamined Patent Application Publication No. 2017-134338 includes a pair of substrates having a display area in which a plurality of pixels are disposed, an optical element layer disposed between these substrates, pixel electrodes and memories disposed in the pixels, a plurality of signal lines to which digital signals to be stored in the memories are supplied, switching elements that connect the memories and the signal lines, a plurality of scanning lines to which scanning signals that controls the switching elements are supplied, a first driver unit, and a second driver unit. The first driver unit is disposed in a peripheral area surrounding the display area, and supplies a digital signal to each of the plurality of signal lines. The second driver unit is disposed in the peripheral area, and supplies a scanning signal to each of the plurality of scanning lines. In this display device, at least a part of the first driver unit is disposed between the display area and the second driver unit.

SUMMARY OF THE INVENTION

The display device described in Japanese Unexamined Patent Application Publication No. 2017-134338 has a memory disposed for each pixel in the display area, adopts a digital driving scheme under which the pixel is driven in accordance with a digital signal stored in the memory, and is configured such that a digital signal supplied to a signal line by the first driver unit is stored in a memory. Note here that the display device described in Japanese Unexamined Patent Application Publication No. 2017-134338 is circular in outer shape, and a plurality of first circuit units constituting the first driver unit and wires through which the first circuit units are connected are interposed between the second driver unit and the display area. In such a configuration, progress in narrowing of a frame makes it difficult to secure sufficient space fir placement of the plurality of first circuit units and the wires through which the first circuit units are connected, undesirably causing a break in a wire or causing a short circuit between wires.

The technology described herein was made under such circumstances, and has as an object to secure sufficient space for placement of lead wires while achieving a narrower frame.

(1) According to the technology described herein, a substrate for a display device includes a signal supply section that supplies a signal, a substrate section having an extended outer shape section whose width is extended with distance from the signal supply section and having a display area configured to display an image by utilizing the signal that is supplied by the signal supply section, a plurality of lead wires, connected to the signal supply section, that extend along the extended outer shape section to the display area, and a circuit section that is placed so that the lead wires are interposed between the display area and the circuit section and that is composed of a plurality of unit circuits arranged along the extended outer shape section. The plurality of unit circuits include a unit circuit having an extension section that extends away from the signal supply section so as to be interposed between a unit circuit that is adjacent to the unit circuit on a side opposite to the signal supply section and the lead wires.

(2) Further, in the substrate, in addition to (1) described above, the plurality of unit circuits may be configured such that one of the plurality of unit circuits that is situated closer to the signal supply section is larger in extension dimension of the extension section than one of the plurality of unit circuits that is situated farther away from the signal supply section.

(3) Further, in addition to (1) or (2) described above, the substrate may further include a plurality of circuit connecting wires, connected to the plurality of unit circuits, respectively, that extend to the display area. Each of the unit circuits may include an output transistor that outputs a signal to a corresponding one of the circuit connecting wires, a capacitor forming section that is connected to a gate electrode and a drain electrode that constitute the output transistor, and a plurality of control transistors placed opposite the display area across the output transistor and the capacitor forming section, and the plurality of unit circuits may include a unit circuit whose extension section is constituted by an output transistor and a capacitor forming section that are disposed to extend farther away from the signal supply section than the plurality of control transistors.

(4) Further, in the substrate, in addition to (3) described above, the plurality of unit circuits may include a first unit circuit whose extension section is constituted by an output transistor and a capacitor forming section that are arranged along a direction of arrangement of the unit circuit, the lead wires, and the display area and a second unit circuit whose extension section is constituted by an output transistor and a capacitor forming section that are arranged along a cross direction crossing the direction of arrangement, and the second unit circuit may be situated closer to the signal supply section than the first unit circuit.

(5) Further, in the substrate, in addition to (4) described above, the output transistors of the first and second unit circuits may share common structures.

(6) Further, in the substrate, in addition to (4) or (5) described above, the plurality of unit circuits may include a third unit circuit whose capacitor forming section is configured to be composed of a first capacitor forming section placed adjacent to the output transistor in the direction of arrangement and a second capacitor forming section placed adjacent to the output transistor in the cross direction, and the third unit circuit may be situated closer to the signal supply section than the first unit circuit and farther away from the signal supply section than the second unit circuit.

(7) Further, in the substrate, in addition to (6) described above, the third unit circuit may have a slit, selectively bored through the second capacitor forming section of the first and second capacitor forming sections constituting the capacitor forming section, through which light is transmitted.

(8) Further, in the substrate, in addition to any of (4) to (7) described above, the capacitor forming section of the second unit circuit of the first and second unit circuits may have a slit, selectively bored therethrough, through which light is transmitted.

(9) Further, in addition to any of (1) to (8) described above, the substrate may further include a plurality of circuit connecting wires, connected to the plurality of unit circuits, respectively, that extend to the display area. Each of the unit circuits may include an output transistor that outputs a signal to a corresponding one of the circuit connecting wires, a capacitor forming section that is connected to a gate electrode and a drain electrode that constitute the output transistor, and a plurality of control transistor placed opposite the display area across the output transistor and the capacitor forming section, and the plurality of unit circuits may include a unit circuit whose extension section is constituted by a capacitor forming section that is disposed to extend farther away from the signal supply section than the plurality of control transistors and the output transistor.

(10) Further, in the substrate, in addition to (9) described above, the plurality of unit circuits may include a unit circuit whose capacitor forming section is divided into a first divided capacitor forming section placed opposite the display area across the output transistor and a second divided capacitor forming section situated closer to the display area than the output transistor, whose extension section is constituted by the second divided capacitor forming section being disposed to extend farther away from the signal supply section than the output transistor and the first divided capacitor forming section.

(11) Further, in the substrate, in addition to (10) described above, the plurality of unit circuits may be configured such that the first divided capacitor forming section of one of the plurality of unit circuits that is situated closer to the signal supply section is smaller than the first divided capacitor forming section of one of the plurality of unit circuits that is situated farther away from the signal supply section and the second divided capacitor forming section of one of the plurality of unit circuits that is situated closer to the signal supply section is larger than the second divided capacitor forming section of one of the plurality of unit circuits that is situated farther away from the signal supply section.

(12) Further, in addition to any of (1) to (11) described above, the substrate may further include a constant-potential line, interposed between the plurality of unit circuits and the plurality of lead wires, that extends along the extended outer shape section.

(13) Further, in addition to (12) described above, the substrate may further include a plurality of circuit connecting wires, connected to the plurality of unit circuits, respectively, that extend to the display area. Each of the circuit connecting wires may include a first circuit connecting wire placed at the same layer as the lead wires and disposed to cross the constant-potential line via an insulating film and a second connecting wire, placed at the same layer as the constant-potential line and disposed to cross the lead wires via the insulating film, that is connected to the first circuit connecting wire through a contact hole bored through the insulating film sandwiched between the first circuit connecting wire and the second circuit connecting wire.

(14) Further, in addition to any of (1) to (13) described above, the substrate may further include a plurality of circuit connecting wires, connected to the plurality of unit circuits, respectively, that extend to the display area. Each of the lead wires may include a cross wiring section that is disposed to cross the circuit connecting wires via an insulating film and a parallel wiring section that is disposed to be offset from the circuit connecting wires and that runs parallel to the circuit connecting wires.

(15) According to the technology described herein, a display device includes the substrate of any of (1) to (14) described above and a counter substrate placed opposite the substrate.

The technology described herein makes it possible to secure sufficient space for placement of lead wires while achieving a narrower frame.

DETAILED DESCRIPTION OF THE INVENTION

Embodiment 1

Figure 1:
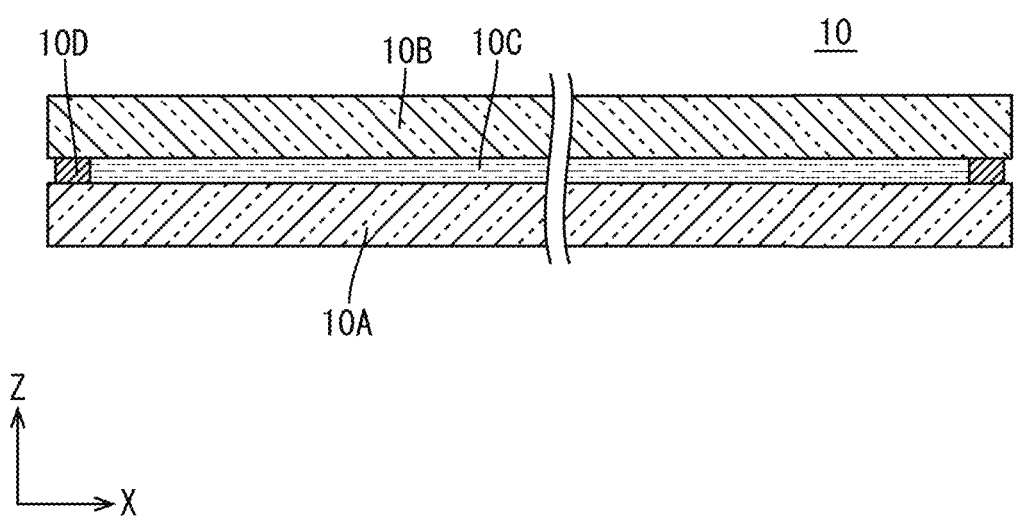
FIG. 1 is a schematic cross-sectional view of a liquid crystal panel according to Embodiment 1.

Embodiment 1 is described with reference to FIGS. 1 to 17. The present embodiment illustrates a liquid crystal panel (display device) 10 and an array substrate (substrate for a display device) 10A. It should be noted that some of the drawings show an X axis, a Y axis, and a Z axis, and are drawn such that each of the axes extends in a corresponding one of the directions shown in the drawings. Further, FIGS. 1, 4, 12, 13, 14, 15, and 16 show front side up and back side down.

FIG. 1 is a schematic cross-sectional view of the liquid crystal panel 10. As shown in FIG. 1, the liquid crystal panel 10 includes an array substrate 10A, a CF substrate (counter substrate) 10B disposed to face a front side (frontal side) of the array substrate 10A, a liquid crystal layer 10C sandwiched between the two substrates 10A and 10B, a sealing section 10D, sandwiched between the two substrates 10A and 10B, that surrounds and seals in the liquid crystal layer 10. The array substrate 10A and the CF substrate 10B are each made of substantially transparent and highly translucent glass with various types of film (including an alignment film for anchoring liquid crystal molecules contained in the liquid crystal layer 10C) stacked in layers on the inside thereof. In the present embodiment, the seal section 10D is made of an ultraviolet-curable resin material (photo-curable resin material). Accordingly, in manufacturing the liquid crystal panel 10, the seal section 10D is applied in an uncured state to at least either one of the pair of substrates 10A and 10B, and then the seal section 10D is cured by irradiating it with light through the array substrate 10A after having bonded together the pair of substrates 10A and 10B. This promotes curing of the seal section 10D, which was in an uncured state, thereby sealing in a space (liquid crystal layer 10C) between the pair of substrates 10A and 10B. Further, polarizing plates are attached to outer surfaces of the two substrates 10A and 10B, respectively.

Figure 2:
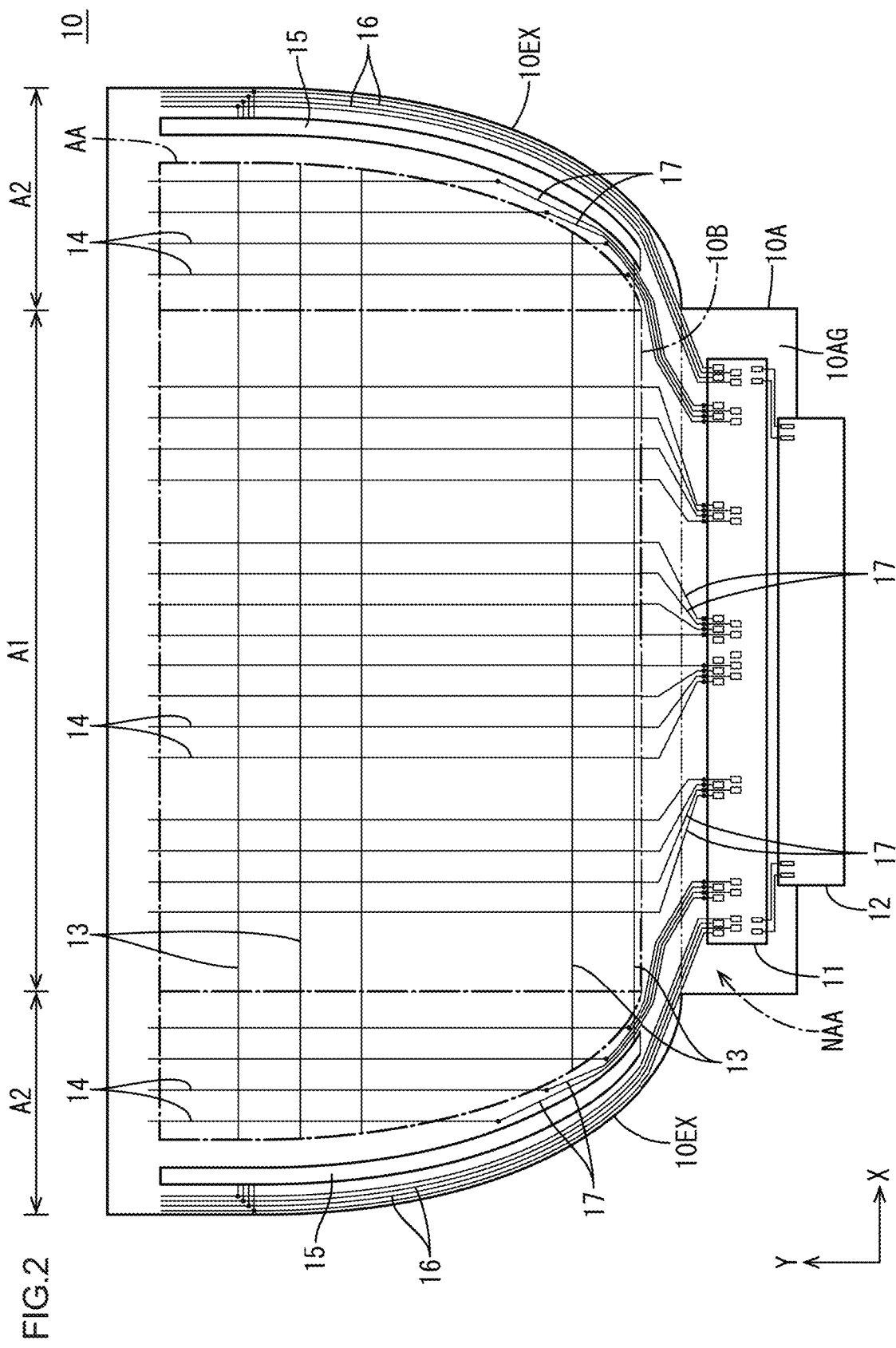
FIG. 2 is a schematic plan view of the liquid crystal panel.

FIG. 2 is a plan view of the liquid crystal panel 10. As shown in FIG. 2, the liquid crystal panel 10, when seen in plan view, has an outer shape that is not a typical square but is an odd shape (non-rectangular shape) including a curved portion (non-linear portion) such as a circular arc as a part of the outer shape. The liquid crystal panel 10 has a horizontally long shape as a whole, and has an extended outer shape section 10EX whose width is extended with distance from the after-mentioned driver (signal supply section) 11. More specifically, the liquid crystal panel 10 includes a first area A1 having a horizontally long square shape when seen in plan view and a pair of second areas A2 each having an extended outer shape section 10EX. Whereas the first area A1 is located at the center in an X-axis direction, the pair of second areas A2 are located at both ends, respectively, of the first area A1 in the X-axis direction so that the first area A1 is interposed between the pair of second areas A2. The first area A1 projects toward one side (in FIG. 2, a lower side) in a Y-axis direction from the second areas A2, and the projecting portion is mounted with a driver 11 and a flexible substrate 12. The pair of second areas A2 have vertically long shapes when seen in plan view and have such outer shapes that corner parts thereof located toward the driver 11 in the Y-axis direction and outward in the X-axis direction are notched into circular arc shapes, and the circular arc portions serve as the extended outer shape sections 10EX. Each second area A2 is configured such that a dimension (width dimension) thereof in the X-axis direction varies according to position in the Y-axis direction, becomes smaller toward the driver 11, and, conversely, becomes larger away from the driver 11, but a width thereof becomes constant at a certain or longer distance from the driver 11. Further, curvatures of the extended outer shape sections 10EX become larger toward the driver 11 in the Y-axis direction and, conversely, become smaller away from the driver 11.

In the liquid crystal panel 10, as shown in FIG. 2, a portion of a screen that is located at the center serves a display area AA (i.e. an area surrounded by dot-and-dash lines in FIG. 2) where an image is displayed, and a frame-shaped outer peripheral portion of the screen that surrounds the display area AA serves as a non-display area NAA where no image is displayed. In the liquid crystal panel 10, the display area AA is placed astride the aforementioned first and second areas A1 and A2 and, when seen in plan view, has an odd shape that is similar to the outer shape of the liquid crystal panel 10. That is, the outer shape of the display area AA includes portions of the liquid crystal panel 10 that run parallel to the extended outer shape sections 10EX. It should be noted that the seal section 10D, which is shown in FIG. 1, too extends in such a manner as to run parallel to the outer shapes of the liquid crystal panel 10 and the display area AA, and includes portions that run parallel to the extended output shape sections 10EX. In the display area AA of the liquid crystal panel 10, a plurality of gate lines (scanning lines) 13 extending along the X-axis direction and a plurality of source lines (image lines, data lines) 14 extending along the Y-axis direction are arranged in gridlike fashion as a whole. In the liquid crystal panel 10, the non-display area NAA is placed astride the first and second areas A1 and A2. The non-display area NAA is an area that is present between the display area AA and an outer edge of the liquid crystal panel 10.

As shown in FIG. 2, the pair of substrates 10A and 10B of the liquid crystal panel 10 each include the aforementioned first and second areas A1 and A2. In the non-display area NAA of a glass substrate 10AG of the array substrate 10A, a pair of gate circuit sections (circuit sections) 15 are provided on both sides, respectively, of the display area AA in the X-axis direction so that the display area AA is interposed between the pair of gate circuit sections 15. The gate circuit sections 15 are monolithically provided using various types of film provided in the array substrate 10A, and serve to supply scanning signals (signals) to the gate lines 13 provided in the display area AA. The gate circuit sections 15 are equal in range of formation in the Y-axis direction to the display area AA so as to be connected to all of the gate lines 13 placed in the display area AA. The gate circuit sections 15 are located in the second areas A2 by being placed between the display area AA and outer edges of the extended outer shape sections 10EX in the non-display area NAA. That is, the gate circuit sections 15 are provided in pair at both ends, respectively, of the display area AA in the X-axis direction so that the display area AA is interposed between the gate circuit sections 15, and are arranged with the display area AA in the same direction as the X-axis direction. The gate circuit sections 15 have outer shapes large portions (i.e. portions excluding upper end portions shown in FIG. 2) of which form circular arc shapes in plan view in such a manner as to run parallel to the extended outer shape sections 10EX. In the non-display area NAA of the array substrate 10A, gate circuit lead wires (circuit lead wires) 16 are provided to make trunk connections between the gate circuit sections 15 and the flexible substrate 12 and supply various types of signal to the gate circuit sections 15.

As shown in FIG. 2, the CF substrate 10B is shorter in short-side dimension than the array substrate 10A, and is bonded to the array substrate 10A in such a manner that one end (in FIG. 2, an upper end) thereof in a short-side direction (Y-axis direction) meets a first end (in FIG. 2, an upper end) of the array substrate 10A in the short-side direction. Accordingly, a second end (in FIG. 2, a lower end) of the array substrate 10A in the short-side direction projects laterally from the CF substrate 10B. That is, the array substrate 10A has its first area A1 further extended to one side in the Y-axis direction than that of the CF substrate 10B, and the extended portion serves as a mounting area for the driver 11 and the flexible substrate 12. In the mounting area in the array substrate 10A for the driver 11 and the flexible substrate 12, terminal sections are provided that are connected via an anisotropic conductive film to terminals of the driver 11 and the flexible substrate 12. The driver 11 is composed of an LSI chip having a driving circuit inside, is mounted on the array substrate 10A by COG (chip on glass), and processes various types of signal that are transmitted by the flexible substrate 12. In the present embodiment, the driver 11 has a long and thin block shape that extends along the X-axis direction, and one driver 11 is mounted in a substantially middle position on the array substrate 10A in the short-side direction (X-axis direction). Signals that are outputted from the driver 11 include image signals that are supplied to the source lines 14 provided in the display area AA. In the non-display area NAA of the array substrate 10A, source lead wires (lead wires) 17 are provided to make trunk connections between the source lines 14 and the driver 11 and supply image signals to the source lines 14. Each of these source lead wires 17 is routed in such a manner as to spread substantially fanwise from the mounting area for the driver 11 to a corresponding one of the source lines 14 of the display area AA, and has a first end connected to a terminal section that is connected to a terminal of the driver 11 and a second end (that faces the display area AA) connected to the source line 14. The flexible substrate 12 is configured by forming a large number of wiring patterns (not illustrated) over a substrate composed of a synthetic resin material (such as polyimide resin) having insulation properties and flexibility. The flexible substrate 12 has a first end connected to the array substrate 10A and a second end connected to an external control substrate (signal supply source). Various types of signal that are supplied from the control substrate are transmitted to the liquid crystal panel 10 via the flexible substrate 12 and, after being processed by the driver 11, are outputted toward the display area AA.

Figure 3:
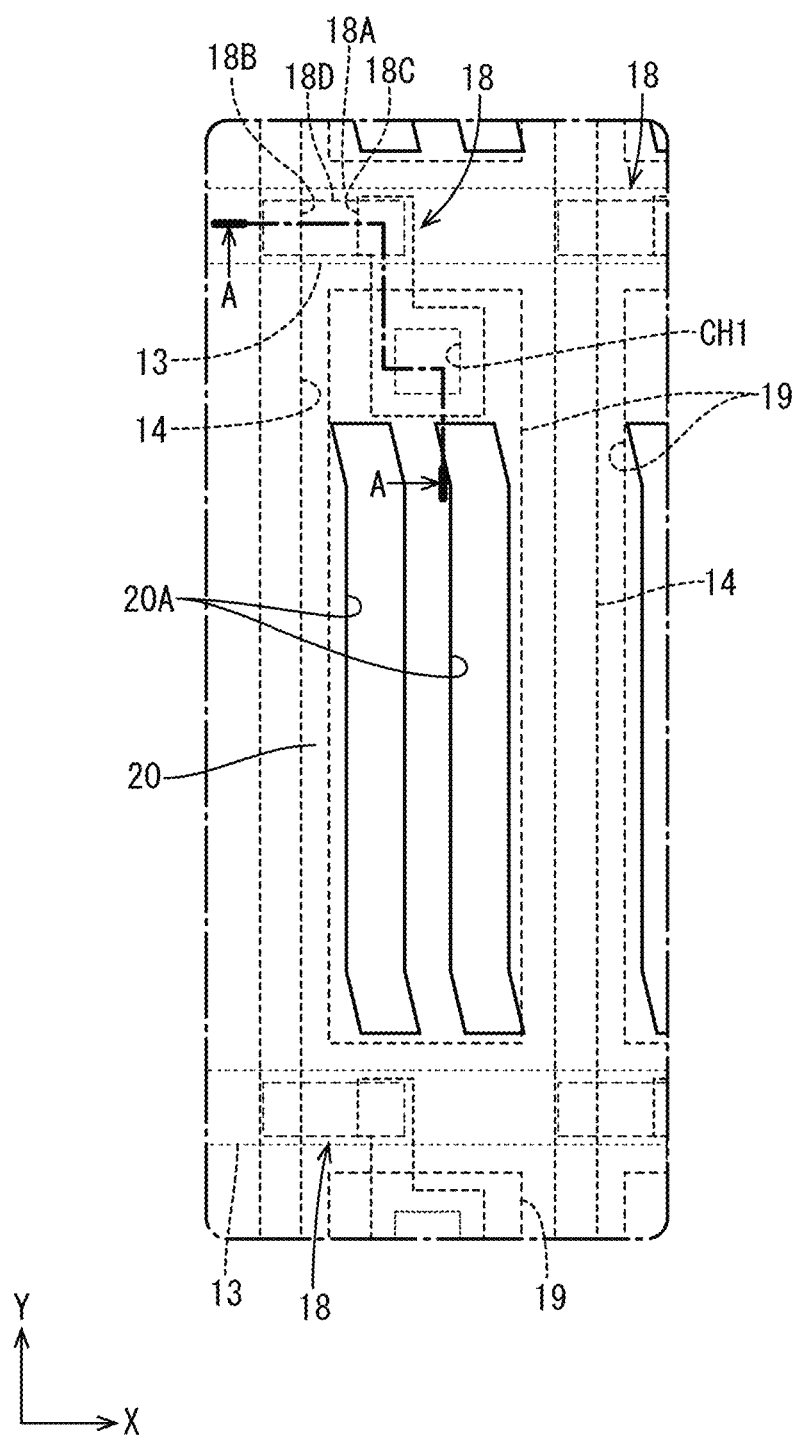
FIG. 3 is a plan view showing an array of pixels in an array substrate constituting the liquid crystal panel.

FIG. 3 is a plan view of the array substrate 10A of the liquid crystal panel 10 in the display area AA. On the inside of the array substrate 10A in the display area AA, as shown in FIG. 3, a pixel transistor 18 and a pixel electrode 19 are provided. A plurality of the pixel transistors 18 and a plurality of the pixel electrodes 19 are arrayed in a matrix (rows and columns) by being placed at spacings along the X-axis direction and the Y-axis direction. The pixel transistor 18 and the pixel electrode 19 are surrounded by gate lines 13 and source lines 14 that substantially orthogonally cross (cross) each other. The pixel transistor 18 has a gate electrode 18A connected to a gate line 13, a source electrode 18B connected to a source line 14, and a drain electrode 18C connected to the pixel electrode 19. Moreover, when driven in accordance with a scanning signal that is supplied to the gate line 13, the pixel transistor 18 supplies, from the source electrode 18B to the drain electrode 18C via a channel section (semiconductor section) 18D, an image signal that is supplied to the source line 14, thereby making it possible to charge the pixel electrode 19 to a potential based on the image signal.

As shown in FIG. 3, the pixel electrode 19 has a vertically long substantially square shape when seen in plan view, and has its short sides extending parallel to a direction of extension of the gate line 13 and its long sides extending parallel to a direction of extension of the source line 14. At a higher layer than the pixel electrode 19 in the array substrate 10A, a substantially solid common electrode 20 is formed in such a manner as to overlap the pixel electrode 19. The common electrode 20 is supplied with a common potential signal (reference potential signal). This common potential signal is a type of constant-potential signal. The term "constant-potential signal" here refers to a signal whose potential hardly fluctuates over time and is substantially constant, and the signal is different in type from the previously mentioned scanning signal, supplied to the gate line 13, whose potential fluctuates over time and the previously mentioned image signal, supplied to the source line 14, whose potential fluctuates over time. A portion of the common electrode 20 that overlaps the pixel electrode 19 has bored therethrough a plurality of pixel electrode overlap openings 20A that extend along the long sides of the pixel electrode 19. Generation of a potential difference between the pixel electrode 19 and the common electrode 20, which overlap each other, causes a fringe field (oblique field) containing a component normal to a board surface of the array substrate 10A in addition to a component parallel to the board surface of the array substrate 10A to be generated between the pixel electrode 19 and opening edges of the pixel electrode overlap openings 20A of the common electrode 20. Accordingly, utilizing this fringe field makes it possible to control a state of alignment of the liquid crystal molecules contained in the liquid crystal layer 10C. That is, the liquid crystal panel 10 according to the present embodiment operates in an FFS mode (fringe field switching) mode. Further, in the display area AA of the CF substrate 10B, a large number of color filters are arranged in a matrix in places on the side of the array substrate 10A opposite to the pixel electrodes 19. The color filters include color filters of three colors, namely R (red), G (green), and B (blue), repeatedly arranged in a predetermined order, and constitute pixels together with the pixel electrodes 19. Further, a light-shielding film (black matrix) for preventing a mixture of colors is formed between each color filter and the other.

Figure 4:
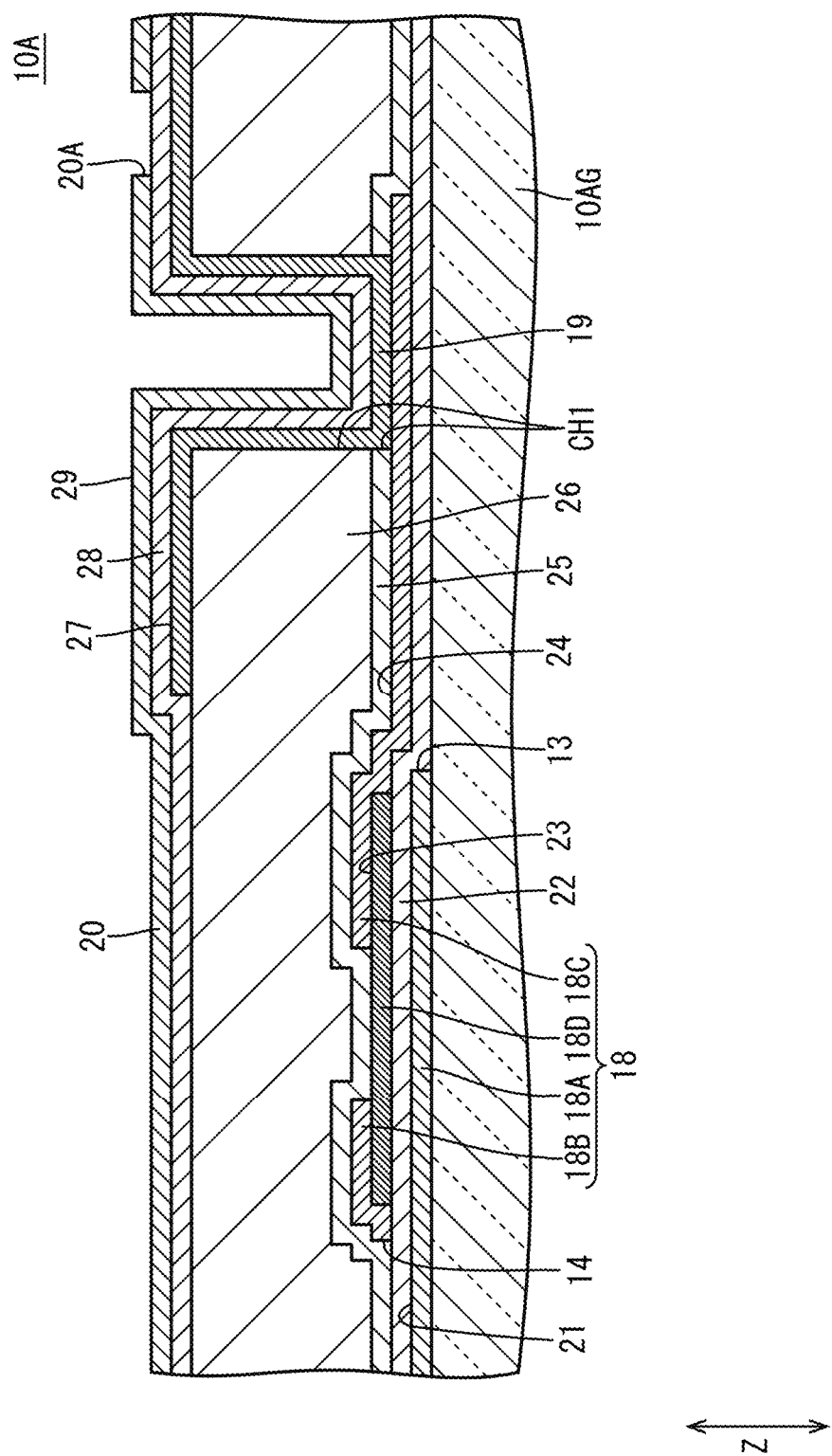
FIG. 4 is a cross-sectional view of the array substrate as taken along line A-A in FIG. 3.

Various types of film stacked in layers on the inside of the array substrate 10A are described here with reference to FIG. 4. FIG. 4 is a cross-sectional view of the liquid crystal panel 10 in and near the pixel transistor 18. In the array substrate 10A, as shown in FIG. 4, a first metal film 21, a gate insulating film (insulating film) 22, a semiconductor film 23, a second metal film 24, a first interlayer insulating film 25, a planarizing film 26, a first transparent electrode film 27, a second interlayer insulating film (interelectrode insulating film) 28, and a second transparent electrode film 29 are staked in this order starting from a lower layer (glass substrate). The first metal film 21 and the second metal film 24 each have conductivity and a light blocking effect by being made of a single-layer film composed of one type of metal material selected from among copper, titanium, aluminum, molybdenum, tungsten, and the like or a laminated film or an alloy composed of different types of metal material. The first metal film 21 constitutes the gate line 13, the gate electrode 18A of the pixel transistor 18, and the like. The second metal film 24 constitutes the source line 14, the source and drain electrodes 18B and 18C of the pixel transistor 18, and the like. The semiconductor film 23 is composed of a thin film made of a semiconductor material such as an oxide semiconductor or amorphous silicon, and constitutes the channel section 18D of the pixel transistor 18 and the like. Using an oxide semiconductor as the semiconductor material of which the semiconductor film 23 is made allows the channel section 18D to have higher mobility, and is therefore suitable to achieving a reduction in size of the pixel transistor 18. The first transparent electrode film 27 and the second transparent electrode 29 are composed of a transparent electrode material (such as ITO (indium tin oxide) or IZO (indium zinc oxide)). The first transparent electrode film 27 constitutes the pixel electrode 19 and the like. The first transparent electrode film 27 is placed at a higher layer than the first interlayer insulating film 25. The second transparent electrode film 29 constitutes the common electrode 20 and the like.

The gate insulating film 22, the first interlayer insulating film 25, and the second interlayer insulating film 28 are each composed of an inorganic material such as silicon nitride ($SiN_x$) or silicon oxide ($SiO_2$). The planarizing film 26 is composed of an organic insulating material (organic material) such as PMMA (acrylic resin), and is greater in film thickness than the other insulating films 22, 25, and 28 composed of an inorganic material. This planarizing film 26 planarizes a surface of the array substrate 10A. The gate insulating film 22 keeps the first metal film 21, which is at a lower layer than the gate insulating film 22, and the semiconductor film 23 and the second metal film 24, which are at a higher layer than the gate insulating film 22, insulated from each other. Accordingly, an intersection between the gate line 13, which is composed of the first metal film 21, and the source line 14, which is composed of the second metal film 24, is insulated by the gate insulating film 22. The first interlayer insulating film 25 and the planarizing film 26 keep the semiconductor film 23 and the second metal film 24, which are at a lower layer than the first interlayer insulating film 25 and the planarizing film 26, and the first transparent electrode film 27, which is at a higher layer than the first interlayer insulating film 25 and the planarizing film 26, insulated from each other. Through places in the first interlayer insulating film 25 and the planarizing film 26 that overlap both the drain electrode 18C of the pixel transistor 18 and the pixel electrode 19, a pixel electrode contact hole CH1 through which the drain electrode 18C is connected to the pixel electrode 19 is bored. The second interlayer insulating film 28 keeps the first transparent electrode film 27, which is at a lower layer than the second interlayer insulating film 28, and the second transparent electrode film 29, which is at a higher layer than the second interlayer insulating film 28, insulated from each other.

Figure 5:
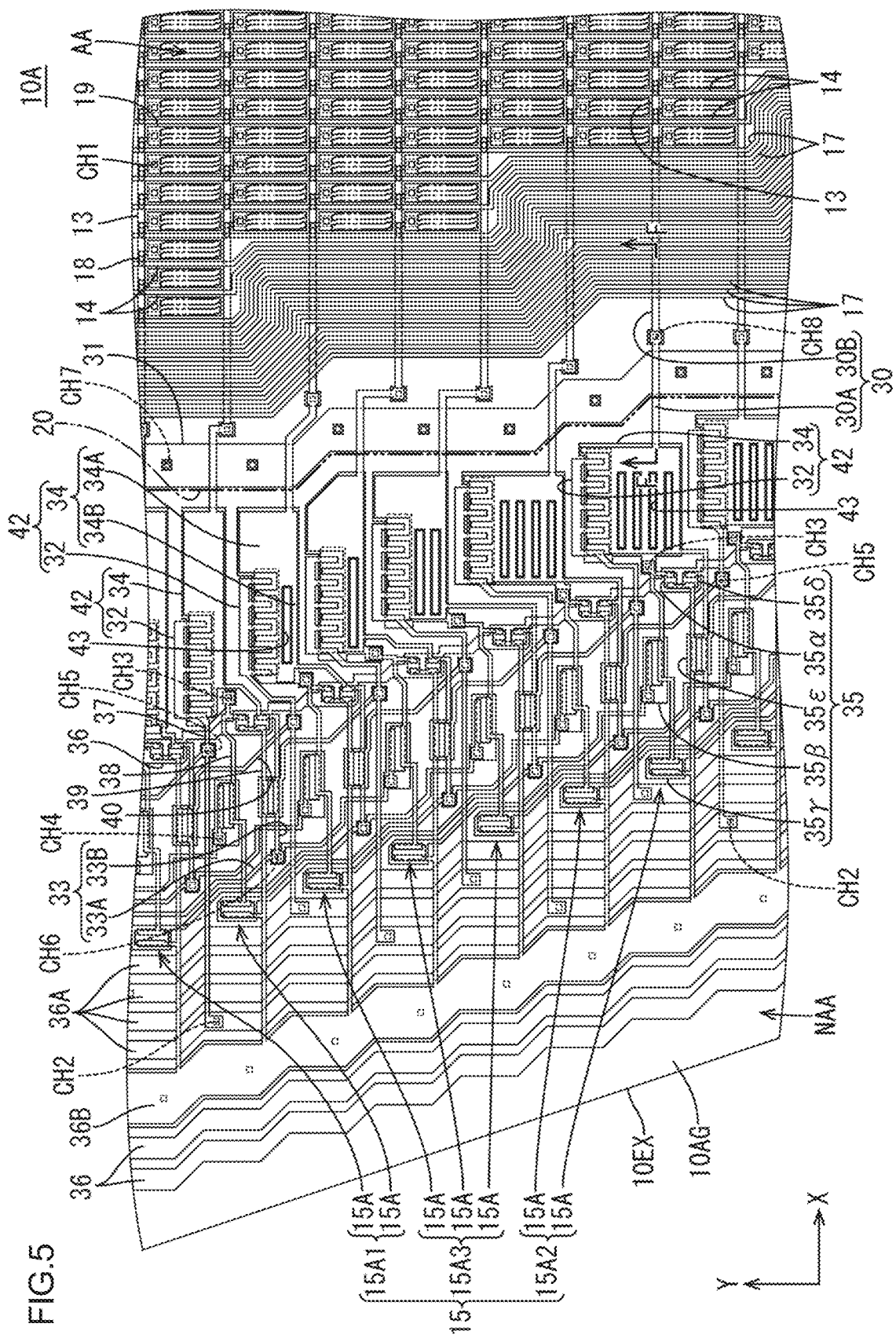
FIG. 5 is a plan view showing a configuration of components in and near an extended outer shape section of the array substrate.
Figure 6:
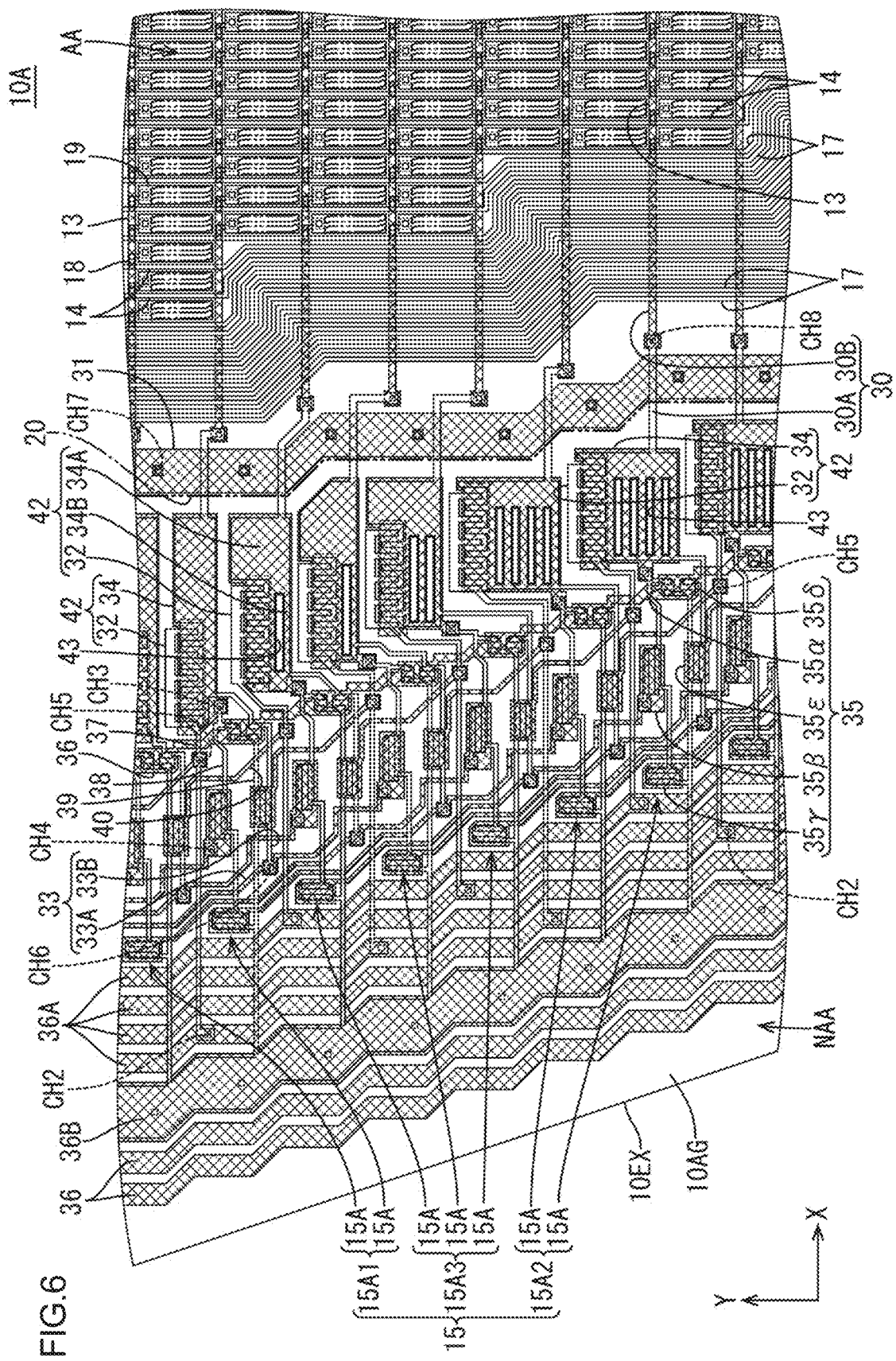
FIG. 6 is a plan view mainly showing a pattern of a first metal film regarding the configuration of the components in and near the extended outer shape section of the array substrate.
Figure 7:
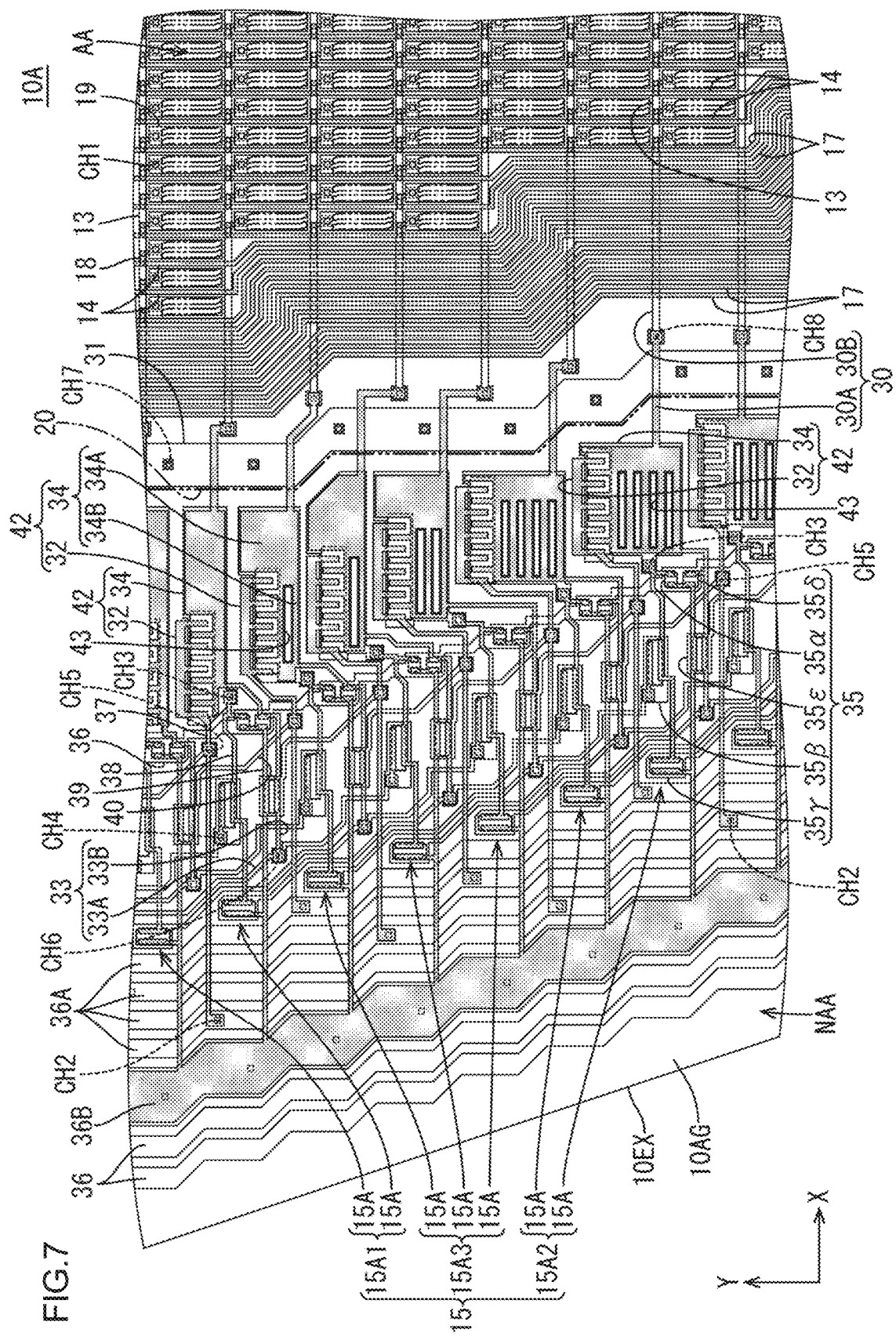
FIG. 7 is a plan view mainly showing a pattern of a second metal film regarding the configuration of the components in and near the extended outer shape section of the array substrate.
Figure 8:
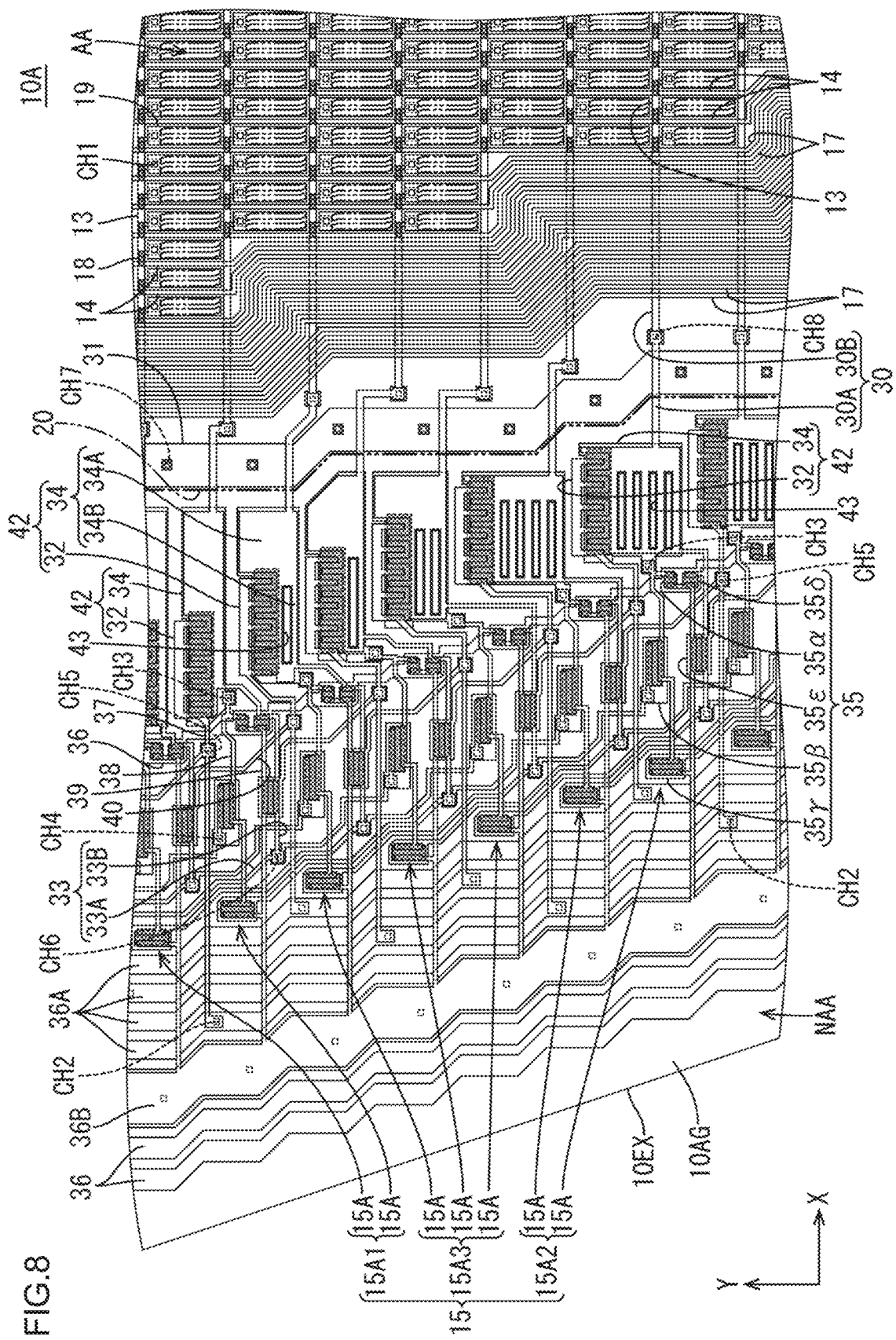
FIG. 8 is a plan view mainly showing a semiconductor film pattern regarding the configuration of the components in and near the extended outer shape section of the array substrate.
Figure 9:
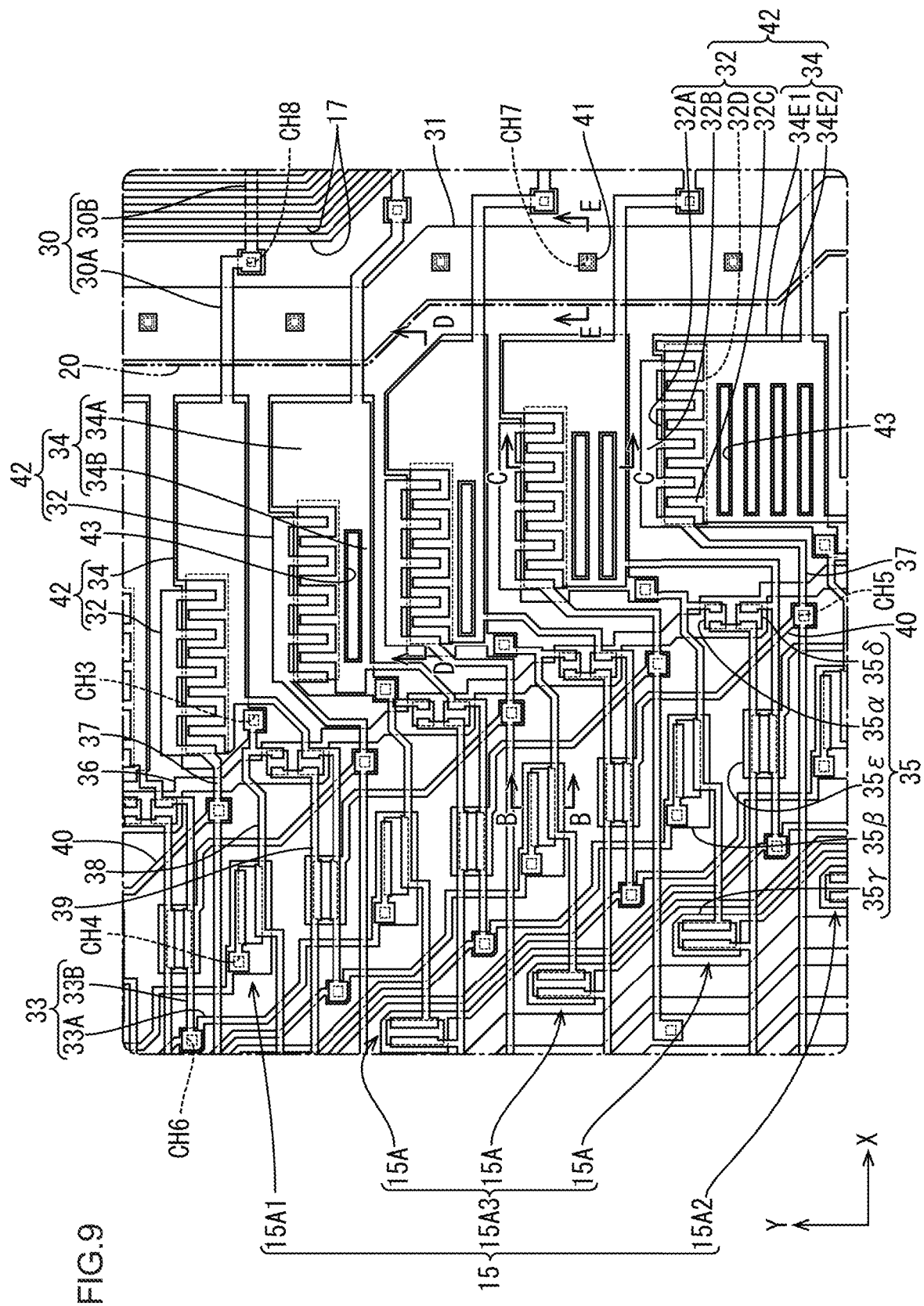
FIG. 9 is an enlarged plan view of unit circuits and nearby components of a gate circuit section in and near the extended outer shape section.
Figure 10:
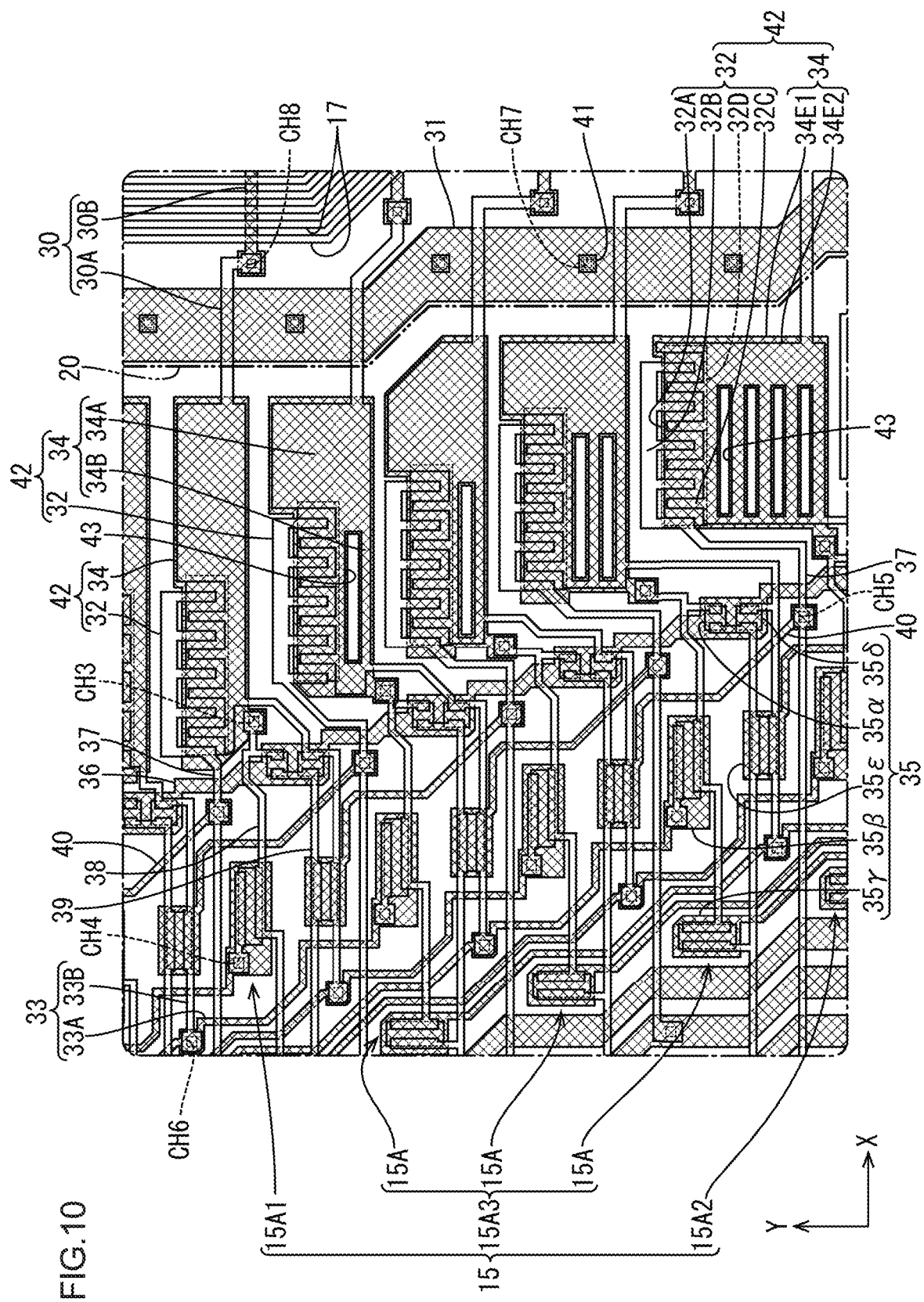
FIG. 10 is a plan view mainly showing the pattern of the first metal film regarding a configuration of the unit circuits and nearby components of the gate circuit section in and near the extended outer shape section.
Figure 11:
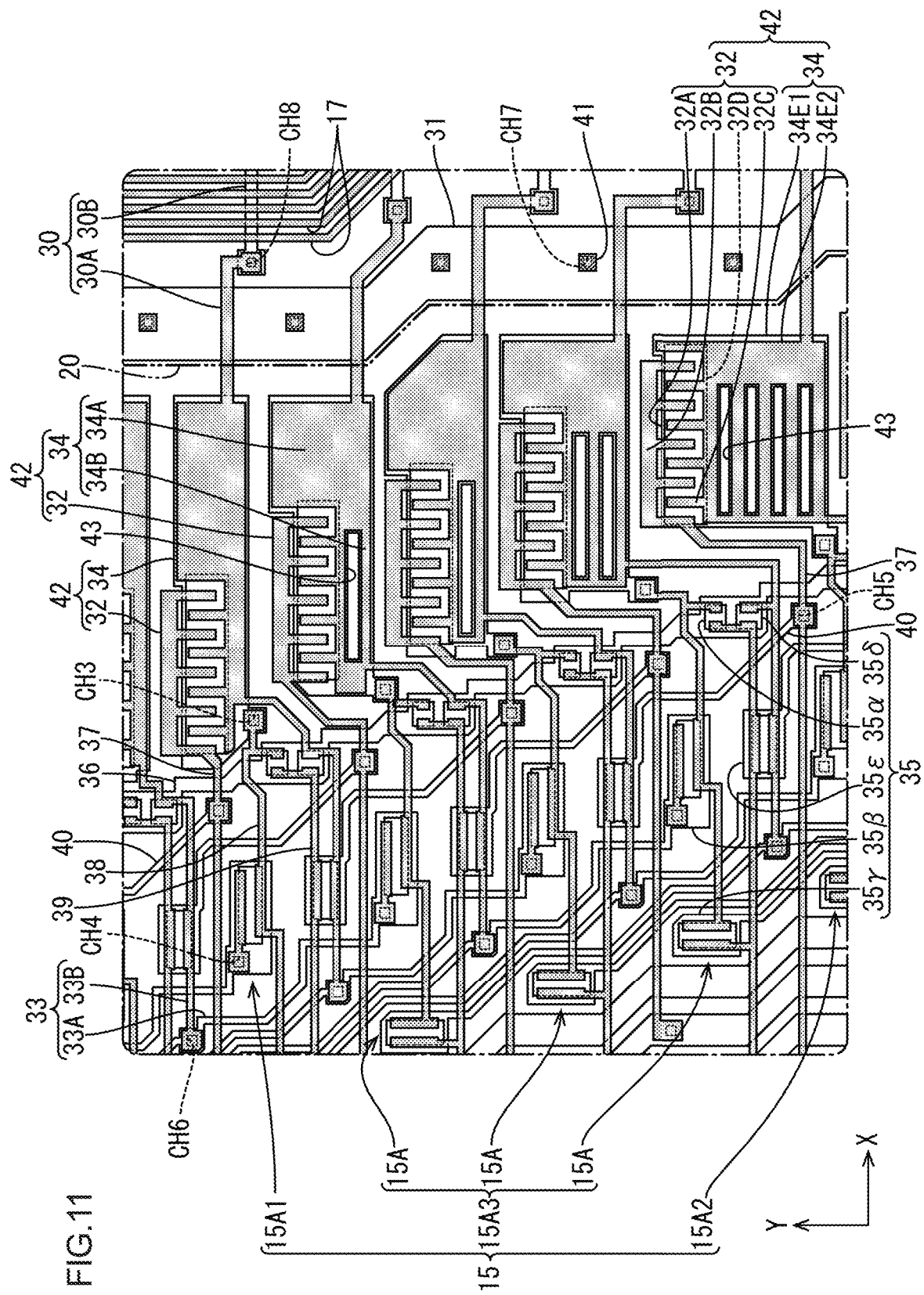
FIG. 11 is a plan view mainly showing the pattern of the second metal film regarding the configuration of the unit circuits and nearby components of the gate circuit section in and near the extended outer shape section.
Figure 12:
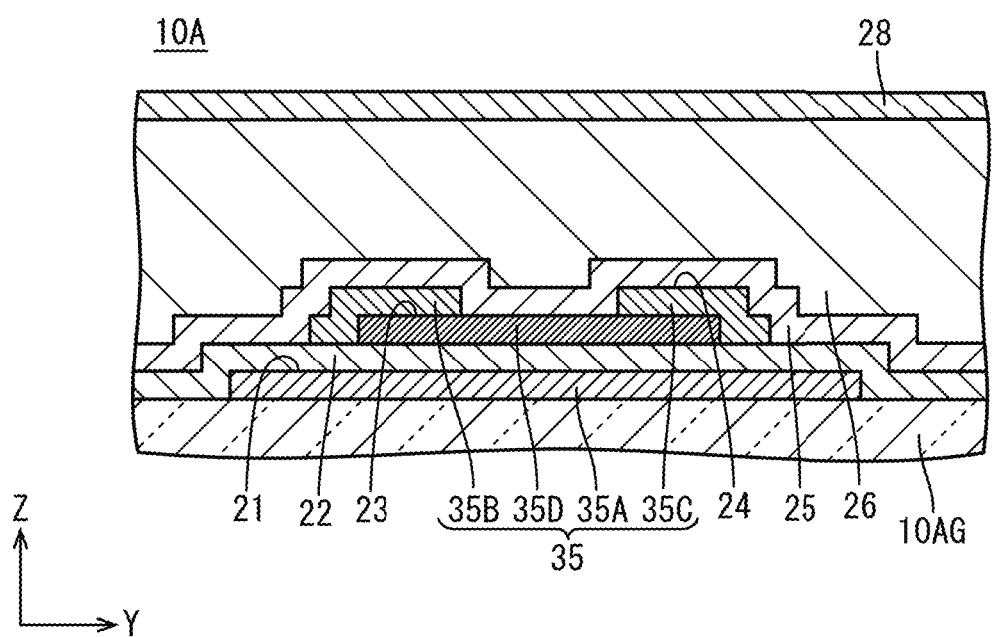
FIG. 12 is a cross-sectional view of the array substrate as taken along line B-B in FIG. 9.
Figure 13:
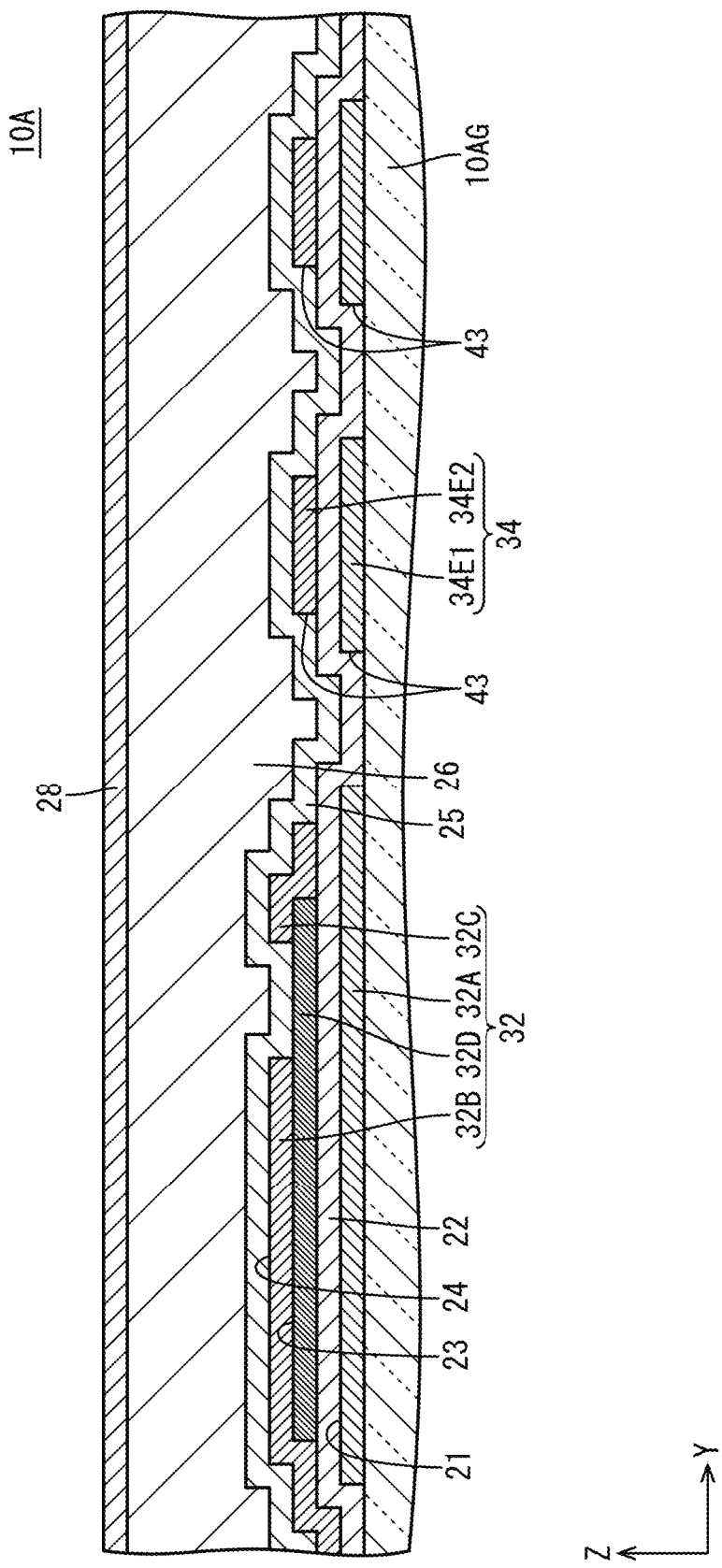
FIG. 13 is a cross-sectional view of the array substrate as taken along line C-C in FIG. 9.
Figure 14:
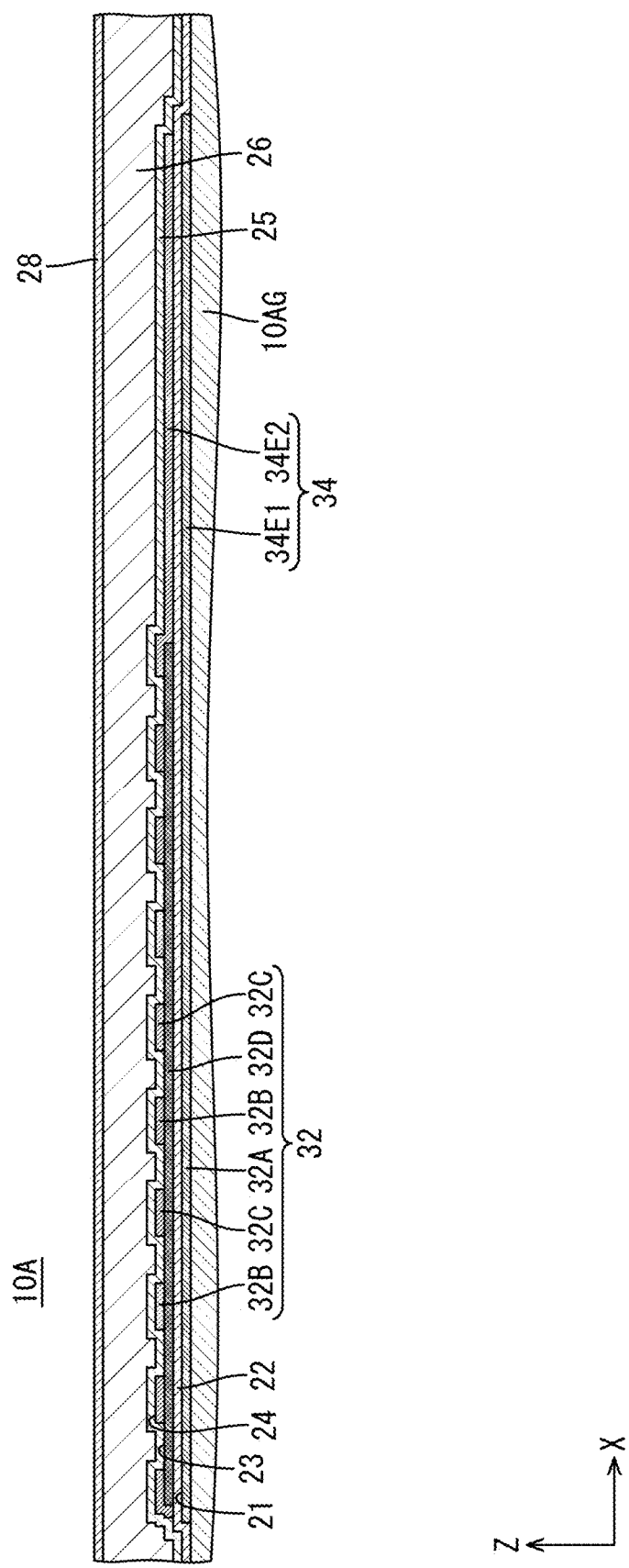
FIG. 14 is a cross-sectional view of the array substrate as taken along line D-D in FIG. 9.

Next, a configuration of a gate circuit section 15 and surrounding components provided in and near an extended outer shape section 10EX is described with reference to FIGS. 5 to 14. FIG. 5 is a plan view showing a configuration of components in and near an extended outer shape section 10EX of the array substrate 10A. FIG. 6 is a plan view mainly showing a pattern of the first metal film 21 regarding the configuration of the components in and near the extended outer shape section 10EX. FIG. 7 is a plan view mainly showing a pattern of the second metal film 24 regarding the configuration of the components in and near the extended outer shape section 10EX. FIG. 8 is a plan view mainly showing a pattern of the semiconductor film 23 regarding the configuration of the components in and near the extended outer shape section 10EX. FIG. 9 is an enlarged plan view of a part of FIG. 5. FIG. 10 is an enlarged plan view of a part of FIG. 6. FIG. 11 is an enlarged plan view of a part of FIG. 7. FIGS. 6, 7, 8, 10, and 11 use different types of half-tone dot meshing to illustrate the patterns of the first metal film 21, the semiconductor film 23, and the second metal film 24. FIG. 12 is a cross-sectional view of a control transistor 35 in the array substrate 10A. FIGS. 13 and 14 are cross-sectional views of an output transistor 32 and a capacitor forming section 34 in the array substrate 10A.

Between the gate circuit section 15 and the display area AA, which are arranged along the X-axis direction, as shown in FIG. 5, a plurality of circuit connecting wires 30 that are connected to the gate circuit 15 and the gate lines 13 of the display area AA, a common line (constant-potential line) 31 that is connected to the common electrode 20, and a plurality of source lead wires 17 are interposed. The circuit connecting wires 30 and the source lead wires 17 will be described in detail later. The common line 31 is a part of the previously mentioned gate circuit lead wires 16, and extends while being repeatedly bent in a zigzag pattern along the extended outer shape section 10EX of the array substrate 10A. The common line 31 can transmit a common potential signal that is supplied from the driver 11 or the flexible substrate 12 and supply the common potential signal to the common electrode 20. A connection structure between the common line 31 and the common electrode 20 will be described later.

The gate circuit section 15 is described in detail. The gate circuit section 15 is a so-called shift register circuit and, as shown in FIG. 5, has a plurality of unit circuits 15A. The plurality of unit circuits 15A are arranged along the outer shape of the array substrate 10A. In particular, a plurality of unit circuits 15A placed in and near the extended outer shape section 10EX are arranged in a substantially circular arc shape (not-linear shape) along the extended outer shape section 10EX so that a unit circuit 15 positioned closer to the driver 11 in the Y-axis direction is positioned closer to the center of the array substrate 10A in the X-axis direction and, conversely, a unit circuit 15 positioned farther away from the driver 11 in the Y-axis direction is positioned closer to an end of the array substrate 10A in the X-axis direction. The plurality of unit circuits 15A are individually connected to and can individually supply scanning signals to the plurality of gate lines 13 via the plurality of circuit connecting wires 30. The number of unit circuits 15A that are included in the gate circuit section 15 is equal to the number of gate lines 13 provided and the number of circuit connecting wires 30 provided. Moreover, the plurality of unit circuits 15 of the gate circuit section 15 can supply scanning signals to the plurality of gate lines 13 in sequence from the upper stage by being connected to one another. Further, a large portion (in FIG. 5, for example, a region extending over output transistors 32 from the end of the array substrate 10A in the X-axis direction) of the gate circuit section 15 is disposed to overlap the seal section 10D (see FIG. 1) when seen in plan view and constitutes a "seal overlap section".

A circuit configuration of each of the unit circuits 15A is described. As shown in FIG. 5, each of the unit circuits 15A includes an output transistor (circuit element) 32 that outputs a scanning signal, a signal output section (signal output line) 33 that transmits a scanning signal that is outputted from the output transistor 32, a capacitor forming section (circuit element) 34 that bootstraps a driving voltage of the output transistor 32 (i.e. a potential of a gate electrode 32A of the output transistor 32) to a potential that is higher than a scanning signal that is outputted from the output transistor 32, and a plurality of control transistors (circuit elements) 35. Among these, the output transistor 32, the capacitor forming section 34, and the control transistors 35 constitute circuit elements of the unit circuit 15A. The output transistor 32 and the capacitor forming section 34 are situated closer to the display area AA (source lead wires 17, common line 31) in the X-axis direction than the plurality of control transistors 35. The plurality of control transistors 35 are placed opposite the display area AA (closer to the extended outer shape section 10EX) in the X-axis direction across (than) the output transistor 32 and the capacitor forming section 34. In the present embodiment, the number of control transistors 35 that are included in one unit circuit 15A is 5, and in a case where these five control transistors 35 are distinguished, they are called "first control transistor 35α", "second control transistor 35β", "third control transistor 35γ", "fourth control transistor 35δ", and "fifth control transistor 35ε", respectively. As shown in FIGS. 6, 7, 8, and 12, the control transistors 35 each have a gate electrode 35A composed of the first metal film 21, source and drain electrodes 35B and 35C composed of the second metal film 24, and a channel section 35D composed of the semiconductor film 23.

As shown in FIGS. 6, 7, 8, and 13, the output transistor 32 has a gate electrode 32A composed of the first metal film 21, source and drain electrodes 32B and 32C composed of the second metal film 24, and a channel section 32D composed of the semiconductor film 23. The source and drain electrodes 32B and 32C of the output transistor 32 form comb-like shapes when seen in plan view and, as shown in FIGS. 7 and 11, have pluralities of branch portions arrayed so at to be alternately placed at substantially equal spacings in the X-axis direction. As shown in FIGS. 6, 7, and 14, the capacitor forming section 34 has a first electrode 34E1 composed of the first metal film 21 and a second electrode 34E2 composed of the second metal film 24. The capacitor forming section 34 is placed so that the first electrode 34E1 and the second electrode 34E2 overlap each other via the gate insulating film 22, which is a dielectric, making it possible to form a capacitance between the two electrodes 34E1 and 34E2. As shown in FIGS. 6 and 7, the signal output section 33 has a first output line 33A composed of the first metal film 21 and a second output line (output line) 33B composed of the second metal film 24.

As shown in FIG. 5, the gate circuit section 15 includes a plurality of (in FIG. 5, eight) gate circuit signal lines 36 through which to supply various types of signal to the unit circuits 15A described above. The plurality of gate circuit signal lines 36 are parts of the previously mentioned gate circuit lead wires 16, and extend while being repeatedly bent in a zigzag pattern along the extended outer shape section 10EX of the array substrate 10A. The gate circuit signal lines 36 include lines (clock lines 36A) through which to supply clock signals for driving the transistors 32 and 35 of the plurality of unit circuits 15A, a line (power supply voltage line 36B) through which to supply a low-level power supply voltage to each transistor 32 or 35 and the capacitor forming section 34, and the like. As shown in FIGS. 6 and 7, the gate circuit signal lines 36 include lines of a single-layer structure composed solely of the first metal film 21 and lines of a laminated structure composed of the first metal film 21 and the second metal film 24, which are connected to each other. All (seven) of the gate circuit signal lines 36 excluding one line that is described next are placed at spacings along the X-axis direction opposite the display area AA in the X-axis direction across a region where the group of control transistors 35 are placed, and at least include four clock lines 36A and one power supply voltage line 36B. On the other hand, one gate circuit signal line 36 overlaps particular control transistors 35 (namely the first control transistor 35α and the fourth control transistor 35δ) in places at spacings opposite the display area AA in the X-axis direction across the output transistor 32, and parts of the gate circuit signal line 36 constitute the gate electrodes 35A of the control transistors 35.

As shown in FIGS. 6 and 10, the output transistor 32 is connected in such a manner that the gate electrode 32A is directly joined to the first electrode 34E1 of the capacitor forming section 34. Accordingly, the output transistor 32 is configured to be driven when the potentials of the gate electrode 32A and the first electrode 34E1 of the capacitor forming section 34 take on values exceeding a threshold voltage. As shown in FIGS. 7 and 11, the output transistor 32 has its source electrode 32B connected to a first end of a first internal wire 37 that is described next. The first internal wire 37 has a second end connected to a clock line 36A of the gate circuit signal lines 36, and can supply the source electrode 32B of the output transistor 32 with a clock signal that is transmitted to the clock line 36A. The first internal wire 37 is composed of the same second metal film 24 as the source electrode 32B and the like, and is routed to the source electrode 32B of the output transistor 32 from the clock line 36A to which it is connected. The first internal wire 37 and the clock line 36A are connected to each other through a clock line contact hole CH2 bored through the gate insulating film 22, which is sandwiched between the first internal wire 37 and the clock line 36A. The output transistor 32 has its drain electrode 32C connected to the second electrode 34E2 of the capacitor forming section 34. The capacitor forming section 34 has its second electrode 34E2 connected to the second output line 33B of the signal output section 33. Furthermore, a circuit connecting wire 30 is connected to either the drain electrode 32C of the output transistor 32 or the second electrode 34E2 of the capacitor forming section 34. Accordingly, when the output transistor 32 is driven, a clock signal that is supplied to the source electrode 32B is transmitted to the drain electrode 32C, so that the second electrode 34E2 of the capacitor forming section 34, the second output line 33B of the signal output section 33, and the circuit connecting wire 30 are all brought to potentials pertaining to the clock signal.

As shown in FIGS. 10 and 11, the capacitor forming section 34 has its first electrode 34E1 connected to one end of a second internal wire 38 that is described next. The second internal wire 38 is composed of the second metal film 24. The second internal wire 38 and the first electrode 34E1 are connected to each other through a first electrode contact hole CH3 bored through the gate insulating film 22, which is sandwiched between the second internal wire 38 and the first electrode 34E1. In addition to being connected to the first electrode 34E1, the second internal wire 38 is connected to the drain electrode 35C of the first control transistor 35α, the drain electrode 35C of the second control transistor 35β, and the drain electrode 35C of the third control transistor 35γ. Among these, the second control transistor 35β has its gate and source electrodes 35A and 35B short-circuited with each other through a second control transistor contact hole CH4 bored through the gate insulating film 22, which is sandwiched between the gate electrode 35A and the source electrode 35B, and has its gate and source electrodes 35A and 35B connected to the first output line 33A of the signal output section 33 of the second unit circuit 15A (up in FIGS. 10 and 11) previous to the current unit circuit 15A. That is, the second control transistor 35β is driven in accordance with a scanning signal that is outputted from the signal output section 33 of the second unit circuit 15A previous to the current unit circuit 15A, and can precharge the second internal wire 38 to a high-level potential based on the scanning signal. Once the second internal wire 38 is precharged, the first electrode 34E1 of the capacitor forming section 34 and the gate electrode 32A of the output transistor are brought to the same potential as the second internal wire 38. This causes the output transistor 32 to be driven. With the output transistor 32 being driven, a change in potential from a low level to a high level of a clock signal that is supplied to the drain electrode 32C causes the second internal wire 38 to be booted (bootstrapped) to an even higher-level potential via a capacitor formed in the capacitor forming section 34. On the other hand, the first control transistor 35α and the third control transistor 35γ have their respective source electrodes 35B connected to a first end of a third internal wire 39 that is described next. As shown in FIG. 7, the third internal wire 39 is composed of the second metal film 24, has a second end connected to the power supply voltage line 36B, and extends substantially along the X-axis direction from the power supply voltage line 36B toward the capacitor forming section 34. Accordingly, once the first control transistor 35α and the third control transistor 35γ are driven, the potential of the second internal wire 38 can be changed to the same low-level potential as the power supply voltage line 36B. The gate electrode 35A of the first control transistor 35α is composed of a part of a gate circuit signal line 36 that it overlaps.

As shown in FIG. 11, the second output line 33B of the signal output section 33 is extended from the second electrode 34E2 of the capacitor forming section 34 toward a side opposite to the display area AA in the X-axis direction and connected to the respective drain electrodes 35C of the fourth and fifth control transistors 35δ and 35ε. The fourth control transistor 35δ and the fifth control transistor 35ε have their respective source electrodes 35B connected to the third internal wire 39 described above. Accordingly, once at least either the fourth control transistor 35δ or the fifth control transistor 35ε is driven, the potential of the signal output section 33 can be changed to the same low-level potential as the power supply voltage line 36B. Among these, the gate electrode 35A of the fourth control transistor 35δ is composed of a part of a gate circuit signal line 36 that it overlaps; therefore, when a signal is supplied to the gate circuit signal line 36, the fourth control transistor 35δ is driven at the same timing as the first control transistor 35α. Further, as shown in FIG. 10, the fifth control transistor 35ε has its gate electrode 35A connected to an external wire 40. The external wire 40 is composed of the first metal film 21, extends substantially along the Y-axis direction, and is connected to the first internal wire 37 of the second unit circuit 15A (down in FIG. 10) subsequent to the current unit circuit 15. The external wire 40 and the first internal wire 37 are connected to each other through an external wire contact hole CH5 bored through the gate insulating film 22, which is sandwiched between the external wire 40 and the first internal wire 37.

As shown in FIGS. 10 and 11, the first output line 33A of the signal output section 33 is connected to an extended end of the second output line 33B opposite to the second electrode 34E2 (i.e. to the display area AA). The first output line 33A and the second output line 33B are connected to each other through an output line contact hole CH6 bored through the gate insulating film 22, which is sandwiched between the first output line 33A and the second output line 33B. The first output line 33A is routed in such a manner as to extend substantially along the Y-axis direction and pass transversely across adjacent unit circuits 15A situated at the previous stage (up in FIGS. 10 and 11) and the subsequent stage (down in FIGS. 10 and 11). The first output line 33A has a first end connected to the gate electrode 35A of the third control transistor 35γ of the second unit circuit 15A previous to the current unit circuit 15A and a second end connected to the gate and source electrodes 35A and 35B of the second control transistor 35β of the second unit circuit 15A subsequent to the current unit circuit 15A. Accordingly, when the output transistor 32 is driven to bring the signal output section 33 to a high-level potential, the third control transistor 35γ of the second unit circuit 15A previous to the current unit circuit 15A is driven, whereby the signal output section 33 connected to the third control transistor 35γ is changed to the same low-level potential as the power supply voltage line 36B. At the same time, the second control transistor 35β of the second unit circuit 15A subsequent to the current unit circuit 15A is driven, whereby the potential of the second internal wire 38 connected to the second control transistor 35β is precharged to a high-level potential.

Figure 15:
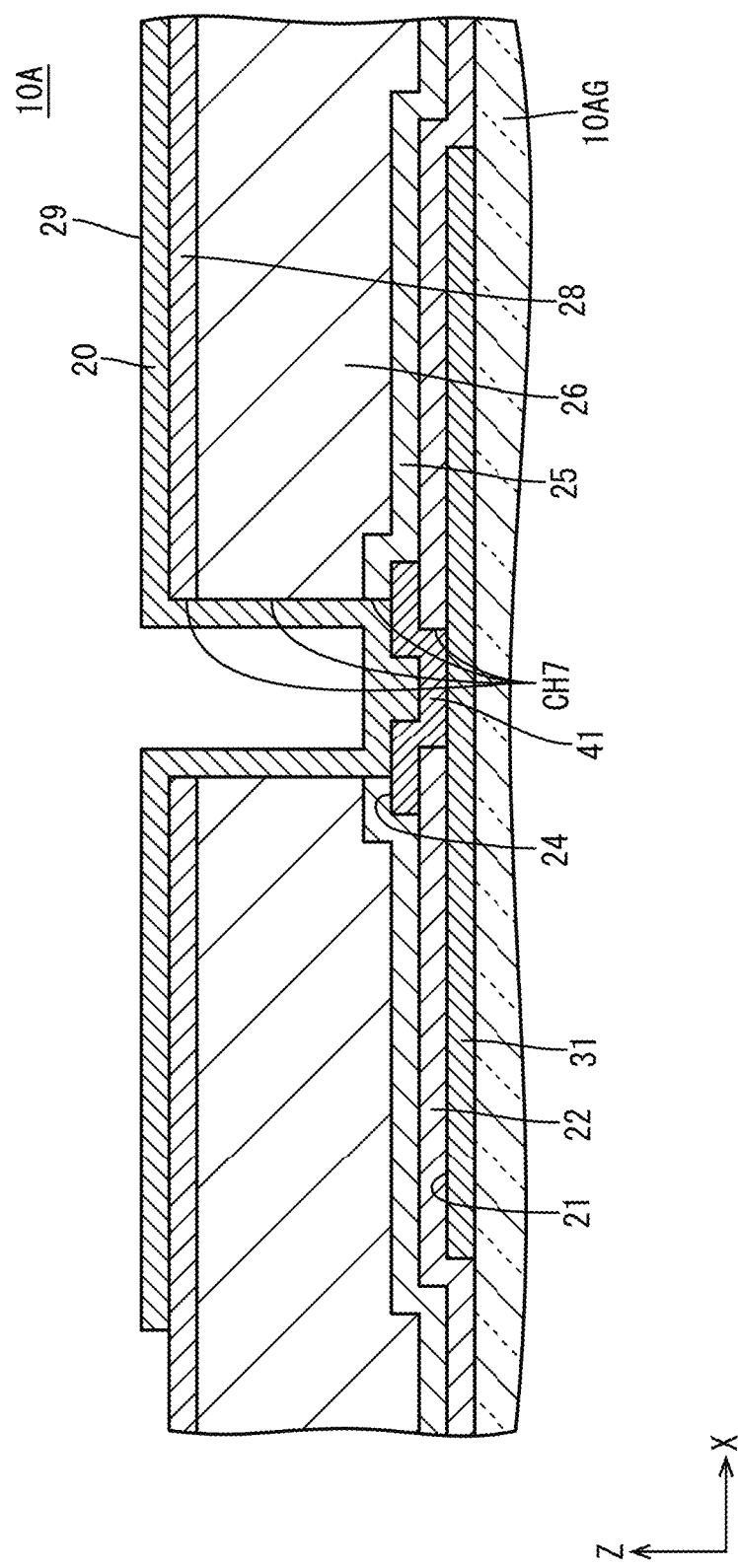
FIG. 15 is a cross-sectional view of the array substrate as taken along line E-E in FIG. 9.
Figure 16:
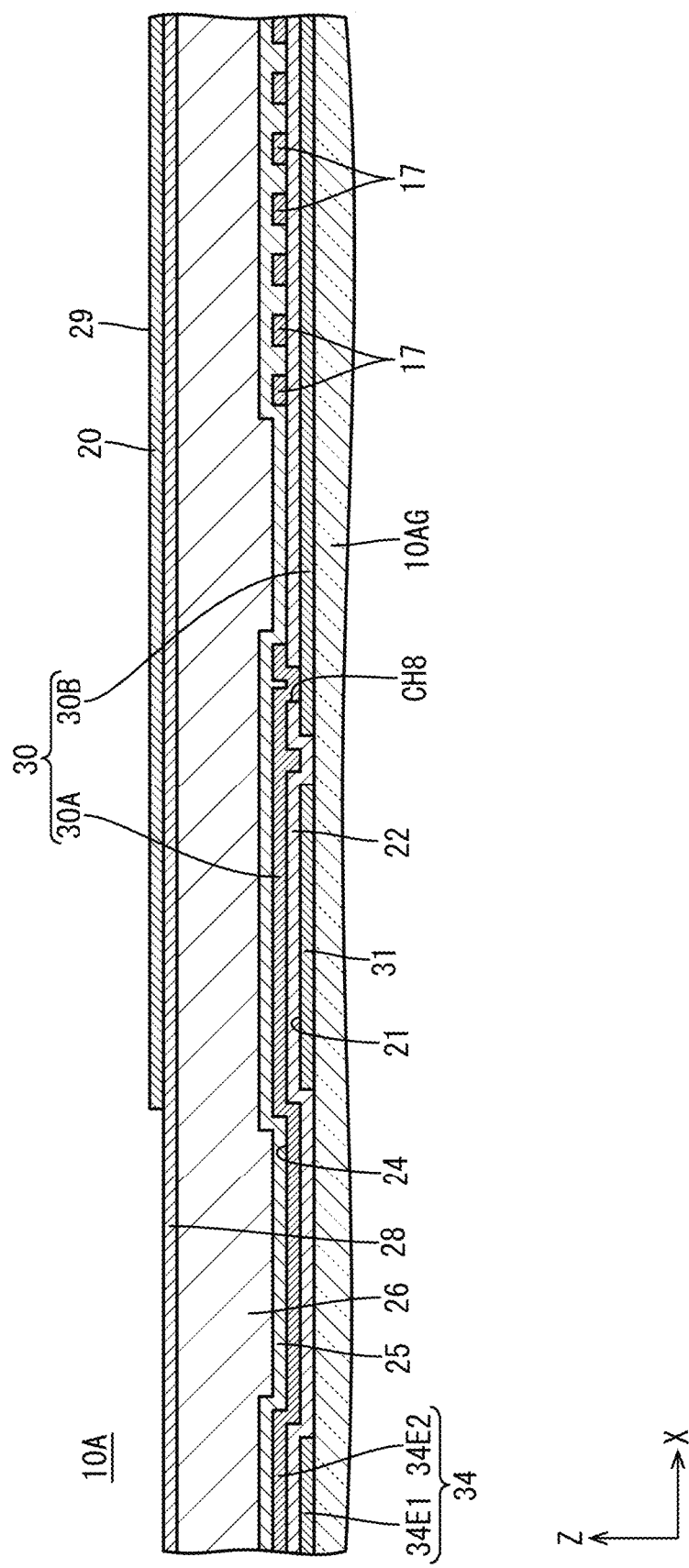
FIG. 16 is a cross-sectional view of the array substrate as taken along line F-F in FIG. 5.

Then, the source lead wires 17, the circuit connecting wires 30, and the common line 31, which are structures interposed between the gate circuit section 15 and the display area AA, are described with reference to FIGS. 15 and 16 in addition to FIGS. 2, 5, 6, 7, 9, 10, and 11. FIG. 15 is a cross-sectional view of the connection structure between the common electrode 20 and the common line 31 in the array substrate 10A. FIG. 16 is a cross-sectional view of the array substrate 10A in the vicinity of source lead wires 17 and a circuit connecting wire 30. First, the connection structure between the common electrode 20 and the common line 31 is described. As shown in FIG. 5, the common electrode 20 is extended from the display area AA to a place in the non-display area NAA located between the gate circuit section 15 and the common electrode 31, and the extended portion overlaps the source lead wires 17 and the common line 31. As shown in FIG. 15, the common electrode 20 and the common line 31, which overlap each other, are connected to each other through a common line contact hole CH7 continuously bored through the gate insulating film 22, the first interlayer insulating film 25, the planarizing film 26, and the second interlayer insulating film 28, which are sandwiched between the common electrode 20 and the common line 31. It should be noted that in a place that overlaps the common line contact hole CH7, an island-shaped intermediate electrode 41 composed of the second metal film 24 is provided, and a connection between the common electrode 20 and the common line 31 is made via this intermediate electrode 41.

Of the plurality of source lead wires 17, as shown in FIG. 2, a plurality of source lead wires 17 interposed between the gate circuit sections 15 and the display area AA are mostly connected to source lines 14 provided in the second areas A2 of the display area AA. It should be noted that of the plurality of source lead wires 17, a plurality of source lead wires 17 that are connected to source lines 14 provided in the first area A1 are not interposed between each of the gate circuit sections 15 and the display area AA. The plurality of source lead wires 17 are each composed of the second metal film 24, and are directly joined to the source lines 14 to which they are connected. As shown in FIG. 7, a plurality of source lead wires 17 that are connected to source lines 14 provided in a second area A2, while being repeatedly bent in a zigzag pattern along the extended outer shape section 10EX, extend from the mounting area for the driver 11 to the source lines 14, located in the second area A2 of the display area AA, to which they are connected. The number of source lead wires 17 that are interposed between each of the gate circuit sections 15 and the display area AA becomes larger toward the driver 11 (toward the lower stage) in the Y-axis direction but becomes smaller away from the driver 11 (toward the upper stage) in the Y-axis direction.

As shown in FIG. 5, the circuit connecting wire 30 has a first end connected to a unit circuit 15A and a second end connected to a gate line 13 of the display area AA. The circuit connecting wire 30 extends substantially along the X-axis direction, and passes transversely across the source lead wires 17 and the common line 31 while extending from the unit circuit 15A to the gate line 13. As shown in FIGS. 6, 7, and 16, the circuit connecting wire 30 is constituted by a first circuit connecting wire 30A, connected to the unit circuit 15A, that passes transversely across the common line 31 and a second circuit connecting wire 30B, connected to the gate line 13, that passes transversely across the source lead wires 17. The first circuit connecting wire 30A is composed of the second metal film 24, and is kept insulated from the common line 31, which it crosses, by the gate insulating film 22, which is sandwiched between the first circuit connecting wire 30A and the common line 31. The second circuit connecting wire 30B is composed of the first metal film 21, and is kept insulated from the source lead wires 17, which it crosses, by the gate insulating film 22, which is sandwiched between the second circuit connecting wire 30B and the source lead wires 17. An end of the second circuit connecting wire 30A opposite to the unit circuit 15A and an end of the second circuit connecting wire 30B opposite to the gate line 13 overlap each other in a place between the common line 31 and the source lead wires 17 in the X-axis direction. The first circuit connecting wire 30A and the second circuit connecting wire 30B are connected to each other through a circuit connecting wire contact hole CH8 bored through the gate insulating film 22, which is sandwiched between sites thereof that overlap each other. It should be noted that the first circuit connecting wire 30A, which is composed of the second metal film 24, is connected to either the drain electrode 32C of the output transistor 32 or the second electrode 34E2 of the capacitor forming section 34 in such a manner as to be directly joined to it. Further, the second circuit connection wire 30B, which is composed of the second metal film 21, is connected to the gate line 13 in such a manner as to be directly joined to it.

Figure 17:
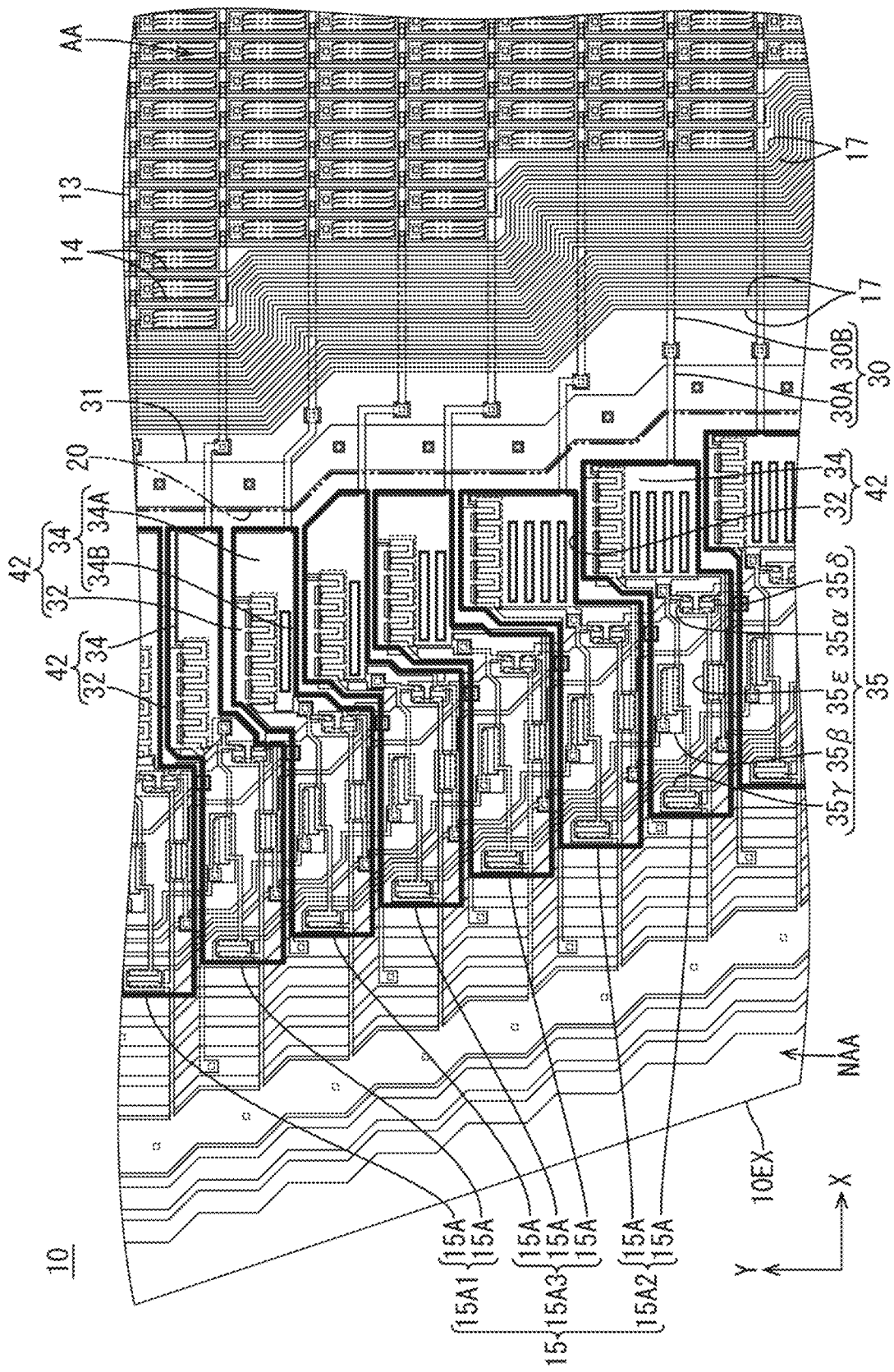
FIG. 17 is a plan view emphatically showing ranges of formation of the unit circuits in and near the extended outer shape section of the array substrate.

Incidentally, as shown in FIG. 17, a gate circuit section 15 according to the present embodiment is characterized in the placement of circuit elements constituting a plurality of unit circuits 15A arranged along an extended outer shape section 10EX of the array substrate 10A. FIG. 17 is a plan view emphatically showing ranges of formation (outer shapes) of the unit circuits 15A in and near the extended outer shape section 10EX of the array substrate 10A. FIG. 17 shows the ranges of formation of the unit circuits 15A by surrounding them with thick solid lines. In a unit circuit 15A placed in and near the extended outer shape section 10EX of the array substrate 10A, one of the three (plurality of) circuit elements that is located closer to the driver 11 in the X-axis direction (on the right side of FIG. 17) than one of the three (plurality of) circuit elements that is located farther away from the driver 11 in the X-axis direction (on the left side of FIG. 17) is disposed to shift farther away from the driver 11 in the Y-axis direction (upward in FIG. 17). That is, the plurality of unit circuits 15A include a unit circuit 15A having an extension section 42 disposed to extend away from the driver 11 so as to be interposed between a unit circuit 15A that is adjacent to the unit circuit 15A on a side opposite to the driver 11 (i.e. on the upper side of FIG. 17) and the source lead wires 17. More specifically, with attention focused on two of the plurality of unit circuits 15A that are adjacent to each other at the upper stage (on the side opposite to the driver 11) and the lower stage (beside the driver 11), the extension section 42 of the lower stage unit circuit 15A is disposed to extend toward the upper stage so as to be interposed between the upper stage unit circuit 15A and the source lead wires 17.

According to such a configuration, as shown in FIG. 17, a unit circuit 15A having an extension section 42 has its extension section 42 disposed to extend toward the upper stage so as to be interposed between a unit circuit 15A at the upper stage and the source lead wires 17, resulting in a smaller space for placement in the X-axis direction (i.e. a direction of arrangement of the unit circuit 15A, the source lead wires 17, and the display area AA). Accordingly, the spacing between the lower stage unit circuit 15A and the display area AA is larger than the spacing between the upper stage unit circuit 15A and the display area AA. This means that the space for placement of the source lead wires 17 interposed between the unit circuit 15A and the display area AA is expanded on a side near the driver 11. On the side near the driver 11, the number of source lead wires 17 is larger than on a side far away from the driver 11, and along with this, the space required for placement of the source lead wires 17 tends to become larger. Accordingly, such an expansion of the space for placement of the source lead wires 17 on the side near the driver 11 makes it possible to secure sufficient line widths of the source lead wires 17 and sufficient spacings between adjacent source lead wires 17. This makes it hard for the source lead wires 17 to get broken or short-circuited. Further, since the extension section 42 is disposed to be interposed between the upper stage unit circuit 15A and the source lead wires 17, the amount of space required of the unit circuit 15A to provide each circuit element can be secured to a certain extent.

It should be noted that since the present embodiment is configured such that the common line 31 is interposed between the plurality of unit circuits 15A and the plurality of source lead wires 17, the space for placement in the X-axis direction in each unit circuit 15A can be made smaller by the extension section 42, whereby the common line 31, which is interposed between the unit circuit 15A and the source lead wires 17, can be situated away from the display area AA. According to this, sufficient space for placement of the plurality of source lead lines 17 is secured between the common line 31 and the display area AA. Further, for the avoidance of a short circuit with the common line 31, the circuit connecting wires 30, which are connected to the unit circuits 15A and the gate lines 13, have their first circuit connecting wires 30A, which cross the common line 31, composed of the same second metal film 24 as the source lead wires 17. For this reason, it is necessary to secure sufficient spacings between the first circuit connecting wires 30A and the source lead wires 17 for the avoidance of a short circuit. In that respect, the space for placement in the X-axis direction in the unit circuit 15A can be made smaller, whereby sufficient spacings between the source lead wires 17 and the first circuit connecting wires 30A can be secured in addition to sufficient space for placement of the plurality of source lead wires 17.

As shown in FIG. 17, the extension section 42 is constituted by the output transistor 32 and the capacitor forming section 34 out of the circuit elements constituting the unit circuit 15A. The output transistor 32 and the capacitor forming section 34 extend toward the upper stage with respect to the group of a plurality of control transistors 35, which are the remaining circuit element of the same unit circuit 15A, and are interposed between the group of a plurality of control transistors 35 provided in the upper stage unit circuit 15A and the source lines 17. Accordingly, unlike the output transistor 32 and the capacitor forming section 34, which constitute the extension section 42, the group of a plurality of control transistors 35 of the unit circuit 15A do not extend toward the upper stage. This makes it possible to make the pluralities of control transistors 35 of the plurality of unit circuits 15A equal in configuration, thus equalizing the current characteristics and parasitic capacitances of the pluralities of control transistors 35 and thereby making circuit design easy.

As shown in FIG. 17, the plurality of unit circuits 15A are configured such that one of the plurality of unit circuits 15A that is situated closer to the driver 11 is larger in extension dimension of the extension section 42 than one of the plurality of unit circuits 15A that is situated farther away from the driver 11. In particular, one of the plurality of unit circuits 15A that is located at the lower stage close to the driver 11 tends to be large in extension dimension of the extension section 42 that extends toward the upper stage and be small in dimension of the extension section 42 in the X-axis direction. In particular, whereas the extension section 42 of one of the plurality of unit circuits 15A that is located at the upper stage is horizontally long substantially square in range of formation when seen in plan view, the extension section 42 of one of the plurality of unit circuits 15A that is located at the lower stage is substantially regular square or vertically long substantially square in range of formation when seen in plan view. On the other hand, the groups of pluralities of control transistors 35, provided in the plurality of unit circuits 15A, that do not constitute the extension sections 42 are horizontally long substantially square in range of formation when seen in plan view and have substantially constant short-side dimensions and long-side dimensions. According to such a configuration, one of the plurality of unit circuits 15A that is located at the lower stage close to the driver 11 tends to be smaller in space for placement in the X-axis direction. Accordingly, a larger space for placement of the source lead wires 17 is secured between a unit circuit 15A situated closer to the driver 11 and the display area AA than between a unit circuit 15A situated farther away from the driver 11 and the display area AA. This makes it hard for the source lead wires 17 to get broken or short-circuited near the driver 11. Further, the groups of pluralities of control transistors 35 of the plurality of unit circuits 15A are substantially constant in range of formation. This makes circuit design easy.

As shown in FIG. 17, the plurality of unit circuits 15A include three types of unit circuit 15A that differ in configuration of the extension section 42 according to positional relationship with the driver 11. That is, the plurality of unit circuits 15A include a first unit circuit 15A1 whose extension section 42 is constituted by an output transistor 32 and a capacitor forming section 34 that are arranged along the X-axis direction (i.e. a direction of arrangement of the unit circuit 15A, the source lead wires 17, and the display area AA), a second unit circuit 15A2 whose extension section 42 is constituted by an output transistor 32 and a capacitor forming section 34 that are arranged along the Y-axis direction (i.e. a cross direction crossing the direction of arrangement), and a third unit circuit 15A3 whose extension section 42 is constituted by a capacitor forming section 34 placed adjacent to an output transistor 32 in the X-axis direction and the Y-axis direction. The first unit circuit 15A1 is situated farther away from the driver 11 than the second unit circuit 15A2 and the third unit circuit 15A3. The second unit circuit 15A2 is situated closer to the driver 11 than the first unit circuit 15A1 and the third unit circuit 15A3. The third unit circuit 15A3 is situated closer to the driver 11 than the first unit circuit 15A1 and farther away from the driver 11 than the second unit circuit 15A2. That is, a plurality of the second unit circuits 15A2, a plurality of the third unit circuits 15A3, and a plurality of the first unit circuits 15A1 are placed in this order in order of decreasing proximity to the driver 11.

As shown in FIG. 17, the second unit circuit 15A2, whose extension section 42 is constituted by an output transistor 32 and a capacitor forming section 34 that are arranged along the Y-axis direction, is smaller in dimension in the X-axis direction than the first unit circuit 15A1, whose extension section 42 is constituted by an output transistor 32 and a capacitor forming section 34 that are arranged along the X-axis direction. Meanwhile, the third unit circuit 15A3, whose extension section 42 is constituted by a capacitor forming section 34 placed adjacent to an output transistor 32 in the X-axis direction and the Y-axis direction, is smaller in dimension in the X-axis direction than the first unit circuit 15A1 but larger in dimension in the X-axis direction than the second unit circuit 15A2. Moreover, since the second unit circuit 15A2 is situated closer to the driver 11 than the first unit circuit 15A1 and the third unit circuit 15A3, a larger space for placement of the source lead wires 17 can be secured between the second unit circuit 15A2 and the display area AA than between the first unit circuit 15A1 and the display area AA or between the third unit circuit 15A3 and the display area AA. Further, since the third unit circuit 15A3 is situated closer to the driver 11 than the first unit circuit 15A1 but farther away from the driver 11 than the second unit circuit 15A2, the space for placement of the source lead wires 17 between the third unit circuit 15A3 and the display area AA is larger than the space for placement of the source lead wires 17 between the first unit circuit 15A1 and the display area AA but smaller than the space for placement of the source lead wires 17 between the second unit circuit 15A2 and the display area AA. Accordingly, the space for placement of the source lead wires 17 between the unit circuits 15A and the display area AA gradually becomes larger toward the driver 11. This makes it hard for the source lead wires 17 to get broken or short-circuited near the driver 11.

As shown in FIG. 17, the capacitor forming section 34 constituting the extension section 42 provided in the third unit circuit 15A3 is substantially in the shape of letter L as a whole when seen in plan view, and is composed of a first capacitor forming section 34A placed adjacent to the output transistor 32 in the X-axis direction and a second capacitor forming section 34B placed adjacent to the output transistor 32 in the Y-axis direction. In the present embodiment, three third unit circuits 15A3 are arranged in a row along the extended outer shape section 10EX, and they differ in dimension of the first capacitor forming section 34A and the second capacitor forming section 34B according to positional relationship with the driver 11. That is, one of the three third unit circuits 15A3 that is closer to the driver 11 (toward the lower stage) is smaller in dimension of the first capacitor forming section 34A in the X-axis direction and larger in dimension of the first capacitor forming section 34A in the Y-axis direction, but is larger in dimension of the second capacitor forming section 34B in the Y-axis direction. It should be noted that the dimension of the second capacitor forming section 34B in the X-axis direction is constant and equal to the dimension of the output transistor 32 in the X-axis direction. According to such a configuration, the secured space for placement of the source lead wires 17 between the plurality of third unit circuits 15A3 and the display area AA can change as appropriate according to positional relationship with the driver 11.

Furthermore, as shown in FIG. 17, the output transistors 32 of the aforementioned first, second, and third unit circuits 15A1, 15A2, and 15A3 are all horizontally long substantially square in range of formation, and share common structures that are constant in short-side dimension and long-side dimension. Such a configuration makes it possible to make the respective output transistors 32 of the first, second, and third unit circuits 15A1, 15A2, and 15A3 equal in configuration, thus equalizing the current characteristics and parasitic capacitances of the respective output transistors 32 and thereby making circuit design easy.

As shown in FIG. 17, the capacitor forming sections 34 of the second and third unit circuits 15A2 and 15A3 of the plurality of unit circuits 15A have slits 43 selectively bored therethrough, through which light is transmitted. That is, the first unit circuits 15A1 have no slits 43 formed therein. In particular, the capacitor forming sections 34 of a second unit circuit 15A2 is provided with a plurality of long and thin slits 43, placed at regular spacings in the Y-axis direction, that extend along the X-axis direction. As in the case of the second unit circuits 15A2, the second capacitor forming sections 34B, included in the capacitor forming sections 34 of the third unit circuits 15A3, that are adjacent to the output transistors 32 in the Y-axis direction are provided with long and thin slits 43 that extend along the Y-axis direction. The second capacitor forming section 34B of the capacitor forming section 34 of one of the three unit circuits 15A3 that is located at the lowest stage adjacent to a second unit circuit 15A2 has two slits 43 placed at spacings in the Y-axis direction.

Note here that of the circuit elements constituting a unit circuit 15A, the output transistor 32 and the control transistors 35 are each formed such that the source electrode 32B or 35B and the drain electrode 32C and 35C overlap the gate electrode 32A or 35A, but since the output transistor 32 and the control transistors 35 are formed in smaller regions than the capacitor forming section 34 or configured to have shapes that are small in width, it is possible, even with a small light transmission region that transmits light, to accelerate curing of the seal with light rounding about from the direction in which their widths are small. On the other hand, since the capacitor forming section 34 is formed by placing the first electrode 34E1 and the second electrode 34E2, which overlap each other, opposite each other, is larger than the output transistor 32 and the control transistors 35, and is configured to have a shape that is not small in width (i.e. a shape that is close to a regular square), the capacitor forming section 34 is largest in light blocking range of the circuit elements constituting the unit circuit 15A. For this reason, in the process of manufacturing the liquid crystal panel 10, ultraviolet light emitted from the direction of the glass substrate 10AG of the array substrate 10A in order to cure the seal section 10D, which is placed over the gate circuit section 15, is blocked most by the capacitor forming section 34 of the circuit elements constituting the unit circuit 15A. In particular, of the plurality of unit circuits 15A, the second unit circuits 15A2 and the third unit circuits 15A3 are each placed such that at least a part of the capacitor forming section 34 is adjacent to the output transistor 32 in a direction along the extended outer shape section 10EX. For this reason, a capacitor forming section 34 serving as a light blocking section is interposed between the output transistors 32 of adjacent unit circuits 15A, and the output transistors 32 and a part of the capacitor forming section 34 form a single entity that serves as a light blocking range having a shape that is not small in width; therefore, there is a risk that the seal section 10D, which extends along the extended outer shape section 10EX, may have uncured sites intermittently formed in a direction of extension of the extended outer shape section 10EX. In that respect, with the slits 43 bored through the capacitor forming sections 34 of the second and third unit circuits 15A2 and 15A3, ultraviolet light that is emitted in the process of manufacturing the liquid crystal panel 10 pass through the slits 43 to be continuously applied to the seal section 10D in a direction of extension of the seal section 10D. This satisfactorily accelerates curing of the seal section 10, bringing about improvement in yield. Further, with no slit 43 formed in the capacitor forming sections 34 of the first unit circuits 15A1, the capacitances that are formed in the capacitor forming sections 34 can be sufficiently secured while the ranges of formation of the capacitor forming sections 34 are kept small.

As described above, an array substrate (substrate for a display device) 10A of the present embodiment includes a driver (signal supply section) 11 that supplies a signal, a glass substrate (substrate section) 10AG having an extended outer shape section 10EX whose width is extended with distance from the driver 11 and having a display area AA configured to display an image by utilizing the signal that is supplied by the driver 11, a plurality of source lead wires (lead wires) 17, connected to the driver 11, that extend along the extended outer shape section 10EX to the display area AA, and a gate circuit section (circuit section) 15 that is placed so that the source lead wires 17 are interposed between the display area AA and the gate circuit section 15 and that is composed of a plurality of unit circuits 15A arranged along the extended outer shape section 10EX. The plurality of unit circuits 15A include a unit circuit 15A having an extension section 42 that extends away from the driver 11 so as to be interposed between a unit circuit 15A that is adjacent to the unit circuit 15A on a side opposite to the driver 11 and the source lead wires 17.

In this way, a signal that is outputted from the driver 11 is transmitted to the source lead wires 17 and supplied to the display area AA. The plurality of source lead lines 17 interposed between the gate circuit section 15 and the display area AA are connected to the driver 11 and extend along the extended outer shape section 10EX of the glass substrate 10AG to the display area AA. On the other hand, the plurality of unit circuits 15A constituting the gate circuit section 15 are arranged along the extended outer shape section 10EX. In such a configuration, whereas the space required between the gate circuit section 15 and the display area AA for placement of the source lead lines 17 tends to become smaller away from the driver 11, the space required between the gate circuit section 15 and the display area AA for placement of the source lead lines 17 tends to become larger toward the driver 11. For this reason, progress in narrowing of a frame makes it difficult to secure sufficient space for placement of the source lead lines 17 near the driver 11, undesirably causing the source lead wires 17 to get broken or short-circuited.

In that respect, the unit circuit 15A, included in the plurality of unit circuits 15A, that has the extension section 42 has a smaller space for placement in the direction of arrangement of the unit circuit 15A, the source lead wire 17, and the display area AA as much as the extension section 42 is interposed between the unit circuit 15A that is adjacent to the unit circuit 15A on the side opposite to the driver 11 and the source lead wires 17. Accordingly, a larger space for placement of the source lead wires 17 can be secured between the unit circuit 15A having the extension section 42 and the display area AA. This makes it possible to secure sufficient line widths of the source lead wires 17 and sufficient spacings between adjacent source lead wires 17, thus making it hard for the source lead wires 17 to get broken or short-circuited.

Further, the plurality of unit circuits 15A are configured such that one of the plurality of unit circuits 15A that is situated closer to the driver 11 is larger in extension dimension of the extension section 42 than one of the plurality of unit circuits 15A that is situated farther away from the driver 11. In this way, a unit circuit 15A situated closer to the driver 11 is smaller in space for placement in the direction of arrangement of the unit circuit 15A, the source lead wires 17, and the display area AA than a unit circuit 15A situated farther away from the driver 11 as much as the extension section 42 is larger in extension dimension. Accordingly, a larger space for placement of the source lead wires 17 is secured between the unit circuit 15A situated closer to the driver 11 and the display area AA than between the unit circuit 15A situated farther away from the driver 11 and the display area AA. This makes it hard for the source lead wires 17 to get broken or short-circuited near the driver 11.

Further, the array substrate 10A further includes a plurality of circuit connecting wires 30, connected to the plurality of unit circuits 15A, respectively, that extend to the display area AA. Each of the unit circuits 15A includes an output transistor 32 that outputs a signal to a corresponding one of the circuit connecting wires 30, a capacitor forming section 34 that is connected to a gate electrode 32A and a drain electrode 32C that constitute the output transistor 32, and a plurality of control transistors 35 placed opposite the display area AA across the output transistor 32 and the capacitor forming section 34, and the plurality of unit circuits 15A include a unit circuit 15A whose extension section 42 is constituted by an output transistor 32 and a capacitor forming section 34 that are disposed to farther extend away from the driver 11 than the plurality of control transistors 35. In this way, the operation of the unit circuit 15A is controlled by the control transistors 35. The potential of the gate electrode 32A of the output transistor 32 is bootstrapped by the capacitor forming section 34 via a capacitor formed by the capacitor forming section 34 to a potential that is higher than the signal that is outputted from the output transistor 32, whereby the amount of current between the source electrode 32B and the drain electrode 32C of the output transistor 32 can be increased. Accordingly, there is higher certainty that the signal will be stably supplied from the output transistor 32 to the circuit connecting wire 30. Moreover, in one of the plurality of unit circuits 15A whose extension section 42 is constituted by the output transistor 32 and the capacitor forming section 34, the plurality of control transistors 35 do not extend like the output transistor 32 or the capacitor forming section 34. This makes it possible to make the pluralities of control transistors 35 of the plurality of unit circuits 15A equal in configuration, thus equalizing the current characteristics and parasitic capacitances of the pluralities of control transistors 35 and thereby making circuit design easy.

Further, the plurality of unit circuits 15A include a first unit circuit 15A1 whose extension section 42 is constituted by an output transistor 32 and a capacitor forming section 34 that are arranged along a direction of arrangement of the unit circuit 15A, the source lead wires 17, and the display area AA and a second unit circuit 15A2 whose extension section 42 is constituted by an output transistor 32 and a capacitor forming section 34 that are arranged along a cross direction crossing the direction of arrangement, and the second unit circuit 15A2 is situated closer to the driver 11 than the first unit circuit 15A1. In this way, the second unit circuit 15A2 is smaller in dimension in the direction of arrangement of the unit circuit 15A, the source lead wires 17, and the display area AA than the first unit circuit 15A1. Moreover, since the second unit circuit 15A2 is situated closer to the driver 11 than the first unit circuit 15A1, a larger space for placement of the source lead wires 17 can be secured between the second unit circuit 15A2 and the display area AA than between the first unit circuit 15A1 and the display area AA. This makes it hard for the source lead wires 17 to get broken or short-circuited near the driver 11.

Further, the output transistors 32 of the first and second unit circuits 15A1 and 15A2 share common structures. This makes it possible to make the respective output transistors 32 of the first and second unit circuits 15A1 and 15A2 equal in configuration, thus equalizing the current characteristics and parasitic capacitances of the respective output transistors 32 and thereby making circuit design easy.

Further, the plurality of unit circuits 15A include a third unit circuit 15A3 whose capacitor forming section 34 is configured to be composed of a first capacitor forming section 34A placed adjacent to the output transistor 32 in the direction of arrangement and a second capacitor forming section 34B placed adjacent to the output transistor 32 in the cross direction, and the third unit circuit 15A3 is situated closer to the driver 11 than the first unit circuit 15A1 and farther away from the driver 11 than the second unit circuit 15A2. In this way, the third unit circuit 15A3 is smaller in dimension in the direction of arrangement of the unit circuit 15A, the source lead wires 17, and the display area AA than the first unit circuit 15A1 but larger in dimension in the direction arrangement than the second unit circuit 15A2. Moreover, since the third unit circuit 15A3 is situated closer to the driver 11 than the first unit circuit 15A1 but farther away from the driver 11 than the second unit circuit 15A2, the space for placement of the source lead wires 17 between the third unit circuit 15A3 and the display area AA is larger than the space for placement of the source lead wires 17 between the first unit circuit 15A1 and the display area AA but smaller than the space for placement of the source lead wires 17 between the second unit circuit 15A2 and the display area AA. Thus, the secured space for placement of the source lead wires 17 between the plurality of unit circuits 15A and the display area AA can change as appropriate according to positional relationship with the driver 11.

Further, the third unit circuit 15A3 has a slit 43, selectively bored through the second capacitor forming section 34B of the first and second capacitor forming sections 34A and 34B constituting the capacitor forming section 34, through which light is transmitted. The output transistor 32 is formed such that the source electrode 32B and the drain electrode 32C overlap the gate electrode 32A, but since the output transistor 32 is configured to have a shape that is small in width, it is possible, even with a small light transmission region that transmits light, to accelerate curing of the seal with light rounding about from the direction in which their widths are small. Meanwhile, the capacitor forming section 34 is configured such that electrodes forming a pair are placed opposite each other and does not have a light transmission region; therefore, when the second capacitor forming section 34B of the capacitor forming section 34 of the third unit circuit 15A3 is placed adjacent to the output transistor 32 in the cross direction, the output transistor 32 and the second capacitor forming section 34B form a single entity that serves as a light blocking range having a shape that is not small in width. Note here that since the second capacitor forming section 34B has a slit 43 selectively bored therethrough, the light transmission region of the output transistor 32 of the third unit circuit 15A3 and the slit 43 of the second capacitor forming section 34B can be positionally related to each other to be arranged along the cross direction. Further, with no slit 43 formed in the first capacitor forming section 34A, the capacitance that is formed in the capacitor forming section 34 can be sufficiently secured.

Further, the capacitor forming section 34 of the second unit circuit 15A2 of the first and second unit circuits 15A1 and 15A2 has a slit 43, selectively bored therethrough, through which light is transmitted. The output transistor 32 is formed such that the source electrode 32B and the drain electrode 32C overlap the gate electrode 32A, but since the output transistor 32 is configured to have a shape that is small in width, it is possible, even with a small light transmission region that transmits light, to accelerate curing of the seal with light rounding about from the direction in which their widths are small. Meanwhile, the capacitor forming section 34 is configured such that electrodes forming a pair are placed opposite each other and does not have a light transmission region; therefore, when the capacitor forming section 34 of each of the first and second unit circuits 15A1 and the second unit circuit 15A2 is placed adjacent to the output transistor 32 in the cross direction, the output transistor 32 and the capacitor forming section 34 form a single entity that serves as a light blocking range having a shape that is not small in width. Note here that since the capacitor forming section 34 of the second unit circuit 15A2 has a slit 43 selectively bored therethrough, the light transmission regions of the output transistors 32 of the plurality of unit circuit 15A and the slit 43 of the capacitor forming section 34 of the second unit circuit 15A2 can be positionally related to each other to be arranged along the cross direction. Further, with no slit 43 formed in the capacitor forming section 34 of the first unit circuit 15A1, the capacitance that is formed in the capacitor forming section 34 can be sufficiently secured.

Further, the array substrate 10A further includes a common line (constant-potential line) 31, interposed between the plurality of unit circuits 15A and the plurality of lead wires 17, that extends along the extended outer shape section 10EX. In this way, the space for placement of the unit circuit 15A having the extension section 42 becomes smaller, whereby the common line 31, which is interposed between the unit circuit 15A having the extension section 42 and the plurality of source lead wires 17, can be situated away from the display area AA. Thus, sufficient space for placement of the plurality of source lead lines 17 is secured between the common line 31 and the display area AA.

Further, the array substrate 10A further includes a plurality of circuit connecting wires 30, connected to the plurality of unit circuits 15A, respectively, that extend to the display area AA. Each of the circuit connecting wires 30 includes a first circuit connecting wire 30A placed at the same layer as the source lead wires 17 and disposed to cross the constant-potential line 31 via a gate insulating film (insulating film) 22 and a second connecting wire 30B, placed at the same layer as the constant-potential line 31 and disposed to cross the source lead wires 17 via the gate insulating film 22, that is connected to the first circuit connecting wire 30A through a circuit connecting wire contact hole (contact hole) CH8 bored through the insulating film 22 sandwiched between the first circuit connecting wire 30A and the second circuit connecting wire 30B. In this way, a signal outputted from a unit circuit 15A is supplied to the display area AA via the first circuit connecting wire 30A disposed to cross the common line 31 via the gate insulating film 22 and the second circuit connecting wire 30B disposed to cross the source lead wires 17 via the gate insulating film 22. Note here that since the first circuit connecting wire 30A is placed at the same layer as the source lead wires 17, it is necessary to place the source lead wires 17 at spacings for the avoidance of a short circuit with the source lead wires 17. In that respect, the space for placement of the unit circuit 15A having the extension section 42 becomes smaller, whereby sufficient spacings between the source lead wires 17 and the first circuit connecting wires 30A can be secured in addition to sufficient space for placement of the plurality of source lead wires 17.

Further, a liquid crystal panel (display device) 10 according to the present embodiment includes the array substrate 10A described above and a CF substrate (counter substrate) 10B placed opposite the array substrate 10A. Such a liquid crystal panel 10, which secures sufficient space for placement of lead wires while achieving a narrower frame in the array substrate 10A, is superior in appearance and satisfactory in display quality.

Embodiment 2

Embodiment 2 is described with reference to FIGS. 18 to 20. Embodiment 2 illustrates changes made to achieve the configuration of unit circuits 115A. It should be noted that a repeated description of structures, actions, and effects which are similar to those of Embodiment 1 described above is omitted.

Figure 18:
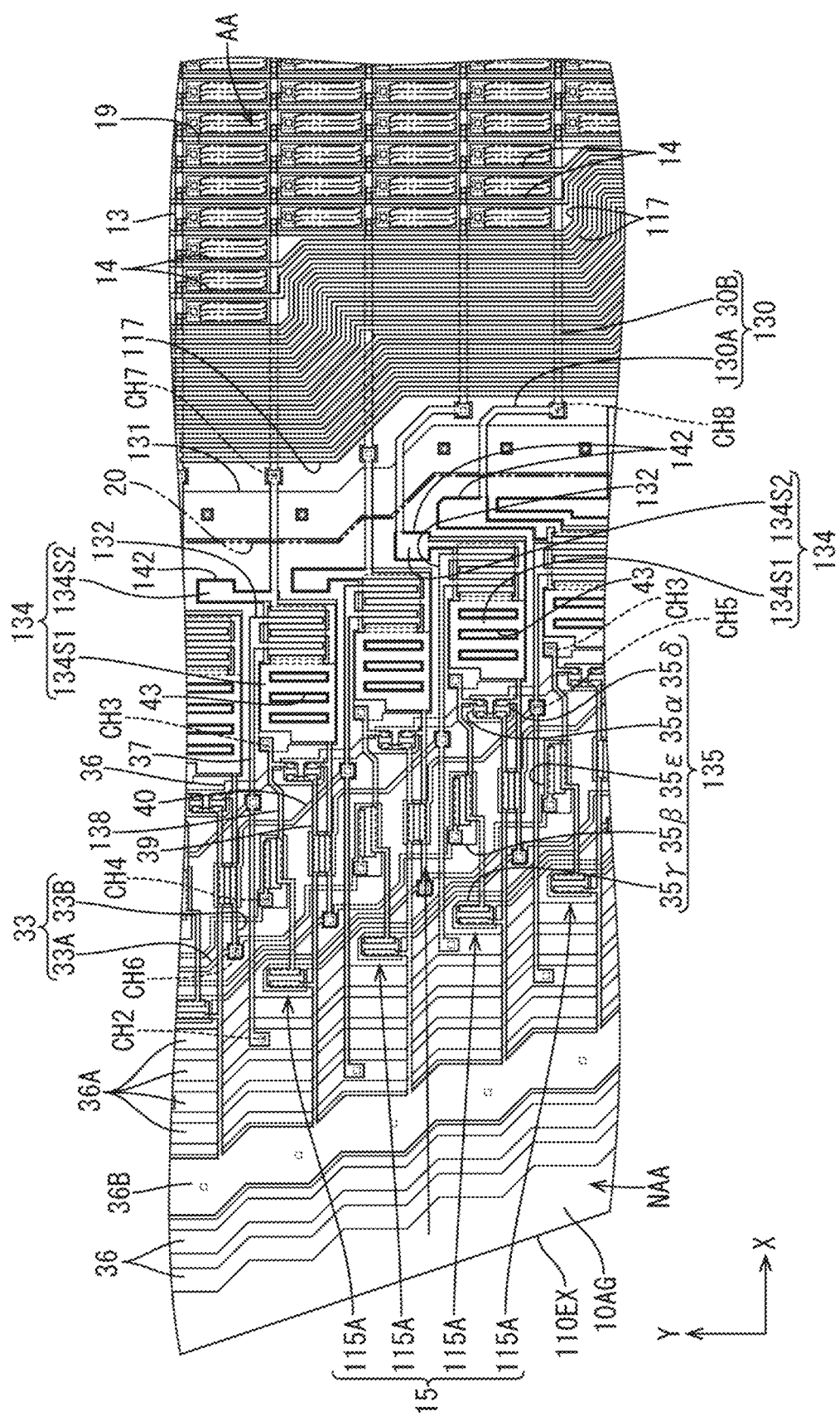
FIG. 18 is a plan view showing a configuration of components in and near an extended outer shape section of an array substrate according to Embodiment 2.

As shown in FIG. 18, each of the unit circuits 115A according to the present embodiment has its extension section 142 constituted exclusively by a capacitor forming section 134. FIG. 18 is a plan view showing a configuration of components in and near an extended outer shape section 110EX of an array substrate 110A. The capacitor forming section 134 is disposed to extend toward the upper stage (farther away from the driver) with respect to (than) a group of a plurality of control transistors 135 and an output transistor 132, which are remaining circuit elements of the same unit circuit 115A, and be interposed between the group of a plurality of control transistors 135 and the output transistor 132 of the upper stage unit circuit 115A and source lead wires 117. Accordingly, as is the case with the group of a plurality of control transistors 135, the output transistor 132 of the unit circuit 115A does not extend toward the upper stage. This makes it possible to make the pluralities of control transistors 135 and the respective output transistors 132 of the plurality of unit circuits 115A equal in configuration, thus equalizing the current characteristics and parasitic capacitances of the pluralities of control transistors 135 and the respective output transistors 132 and thereby making circuit design easy.

As shown in FIG. 18, of the circuit elements constituting the unit circuit 115A, the output transistor 132 and the group of a plurality of control transistors 135, which do not constitute the extension section 142, share common structures among the plurality of unit circuits 115A. That is, the respective output transistors 132 of the plurality of unit circuits 115A are all vertically long substantially square in range of formation, and share common structures that are substantially constant in short-side dimension and long-side dimension. It should be noted that the group of a plurality of control transistors 135 are configured as described above in Embodiment 1. Such a configuration makes it possible to make the respective output transistors 132 of the plurality of unit circuits 115A equal in configuration, thus equalizing the current characteristics and parasitic capacitances of the respective output transistors 132 and thereby making circuit design easy.

Figure 19:
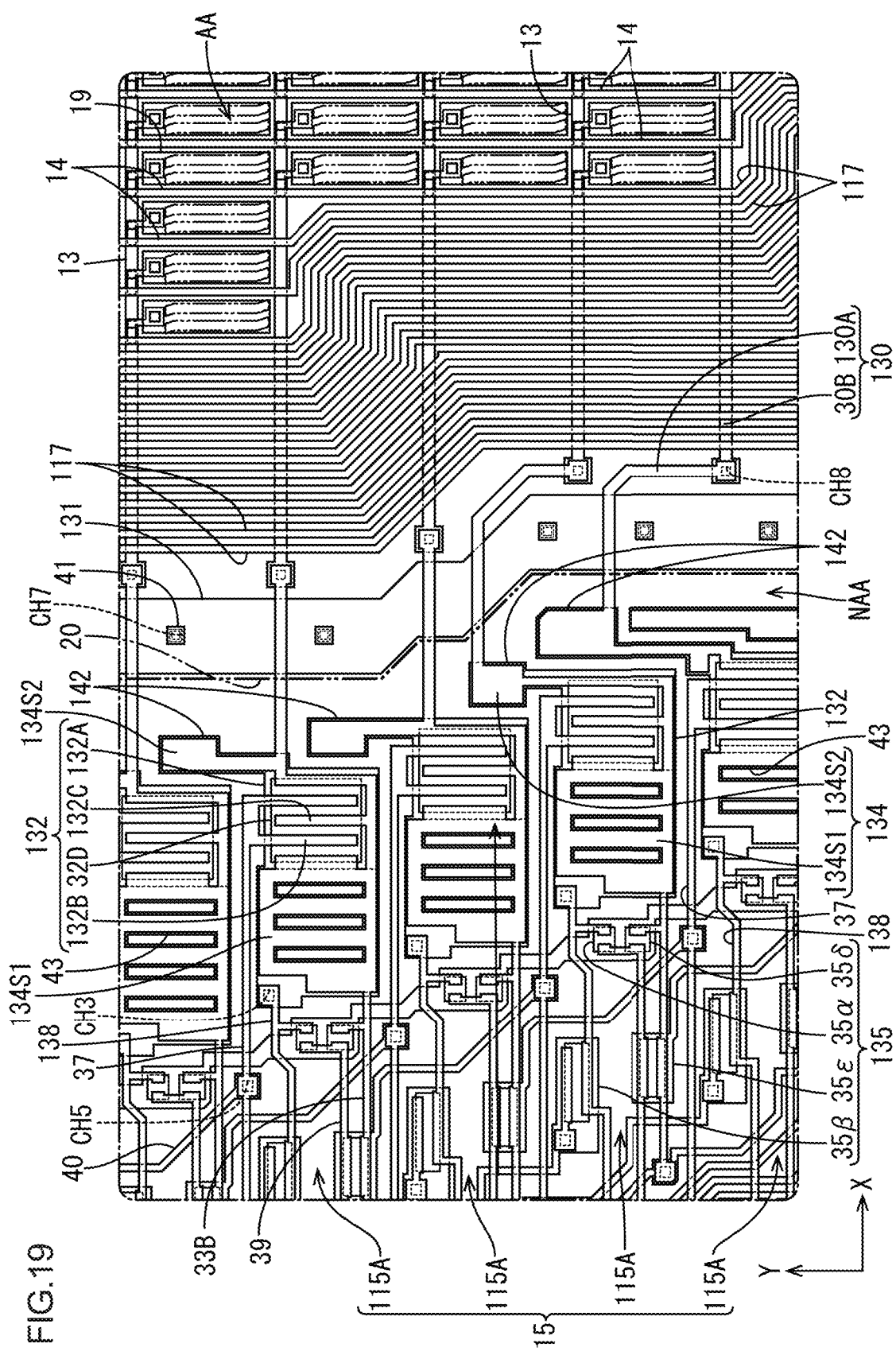
FIG. 19 is an enlarged plan view of unit circuits and nearby components of a gate circuit section in and near the extended outer shape section.

FIG. 19 is an enlarged plan view of a part of FIG. 18. FIG. 20 is a plan view mainly showing patterns of a first metal film and a second metal film regarding a configuration of components in and near the extended outer shape section 10EX. FIG. 20 uses different types of half-tone dot meshing to illustrate the patterns of the first metal film and the second metal film. As shown in FIGS. 19 and 20, the capacitor forming section 134 is divided into a first divided capacitor forming section 134S1 situated closer to the group of a plurality of control transistor 135 than the output transistor 132 (i.e. placed opposite the display area AA across the output transistor 132) and a second divided capacitor forming section 134S2 situated closer to the display area AA than the output transistor 132. The first capacitor forming section 134S1 is interposed between the output transistor 132 and the group of a plurality of control transistors 135 in the X-axis direction. The first divided capacitor forming section 134S1 is constituted by a first electrode 134E1 connected to a gate electrode 132A of the output transistor 132 and connected to a second internal wire 138 through a first electrode contact hole CH3. The second capacitor forming section 134S2, which constitutes the extension section 142, is connected to an end of the output transistor 132 that faces the display area AA (i.e. that faces a common line 131) and extends closer to the upper stage (farther away from the driver) along the Y-axis direction than the output transistor 132 and the first divided capacitor forming section 134S1. Accordingly, the second divided capacitor forming section 134S2 is interposed between an adjacent unit circuit 115A at the upper stage and the source lead wires 117. The second divided capacitor forming section 134S2 is larger in width at an extension tip end portion thereof than at an extension base end portion thereof. The second divided capacitor forming section 134S2 is constituted by a second electrode 134E2 connected to a first circuit connecting wire 130A of a circuit connecting wire 130. Note here that since the first divided capacitor forming section 134S1, which does not constitute the extension section 142, is placed opposite the display area AA across the output transistor 132, the first divided capacitor forming section 134S1 avoids exerting influence on the circuit configuration of the other unit circuits 115A by not extending like the second divided capacitor forming section 134S2. On the other hand, the second divided capacitor forming section 134S2, which constitutes the extension section 142, is situated closer to the display area AA than the output transistor 132, the second divided capacitor forming section 134S2 is placed using a space that is present closer to the display area AA than the output transistor 132 and may exert less influence on the circuit configuration of the other unit circuits 115A.

Figure 20:
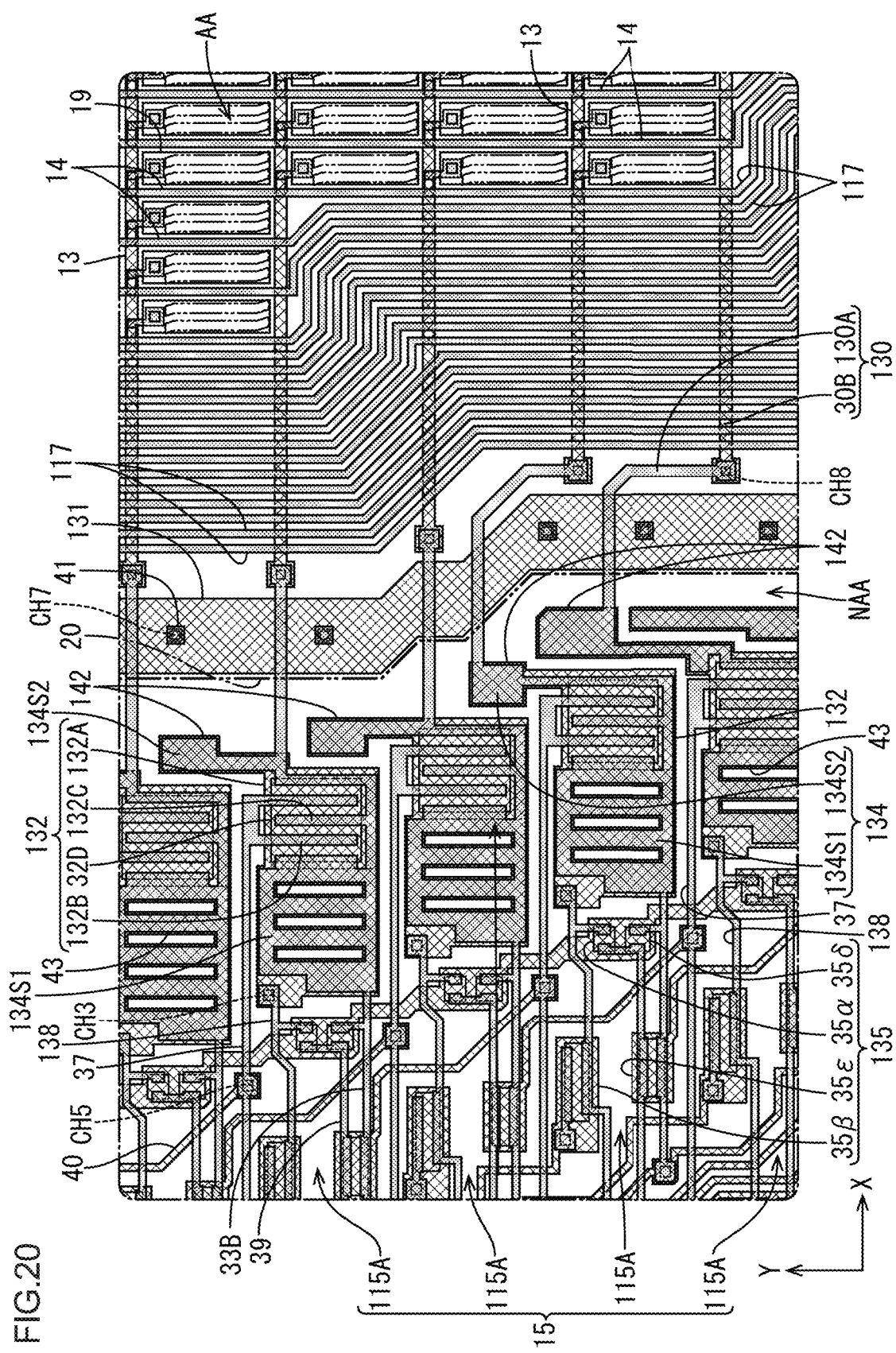
FIG. 20 is a plan view mainly showing patterns of a first metal film and a second metal film regarding a configuration of the unit circuits and nearby components of the gate circuit section in and near the extended outer shape section.

Furthermore, as shown in FIGS. 19 and 20, the plurality of unit circuits 115A are configured such that the first divided capacitor forming section 134S1 of a lower stage unit circuit 115A (situated closer to the driver) is smaller than the first divided capacitor forming section 134S1 of an upper stage unit circuit 115A (situated farther away from the driver) and the second divided capacitor forming section 134S2 of a lower stage unit circuit 115A (situated closer to the driver) is larger than the second divided capacitor forming section 134S2 of an upper stage unit circuit 115A (situated farther away from the driver). Specifically, the plurality of unit circuits 115A are configured such that while the respective first divided capacitor forming sections 134S1 are constant in dimension in the Y-axis direction, the first divided capacitor forming section 134S1 of an upper stage unit circuit 115A is larger in dimension in the X-axis direction and, conversely, the first divided capacitor forming section 134S1 of a lower stage unit circuit 115A is smaller in dimension in the X-axis direction. The plurality of unit circuits 115A are configured such that the second divided capacitor forming section 134S2 of an upper stage unit circuit 115A is smaller in area at the extension tip end portion thereof and the second divided capacitor forming section 134S2 of a lower stage unit circuit 115A is larger in area at the extension tip end portion thereof. According to such a configuration, a lower stage unit circuit 115A is smaller in dimension in the X-axis direction than an upper stage unit circuit 115A. Accordingly, a larger space for placement of the source lead wires 117 is secured between a lower stage unit circuit 115A and the display area AA than between an upper stage unit circuit 115A and the display area AA. This makes it harder for the source lead wires 117 to get broken or short-circuited near the driver. Further, since a lower stage unit circuit 115A has a smaller first divided capacitor forming section 134S1 and a larger second divided capacitor forming section 134S2, the capacitor forming sections 134 of the plurality of unit circuits 115A can be kept equal in area.

According to the present embodiment, as described above, the array substrate 110A further includes a plurality of circuit connecting wires 130, connected to the plurality of unit circuits 115A, respectively, that extend to the display area AA. Each of the unit circuits 115A includes an output transistor 132 that outputs a signal to a corresponding one of the circuit connecting wires 130, a capacitor forming section 134 that is connected to a gate electrode 132A and a drain electrode 132C that constitute the output transistor 132, and a plurality of control transistor 135 placed opposite the display area AA across the output transistor 132 and the capacitor forming section 134, and the plurality of unit circuits 115A include a unit circuit 115A whose extension section 142 is constituted by a capacitor forming section 134 that is disposed to extend farther away from the driver than the plurality of control transistors 135 and the output transistor 132. In this way, the operation of the unit circuit 115A is controlled by the control transistors 135. The potential of the gate electrode 132A of the output transistor 132 is bootstrapped by the capacitor forming section 134 via a capacitor formed by the capacitor forming section 134 to a potential that is higher than the signal that is outputted from the output transistor 132, whereby the amount of current between the source electrode 132B and the drain electrode 132C of the output transistor 132 can be increased. Accordingly, there is higher certainty that the signal will be stably supplied from the output transistor 132 to the circuit connecting wire 130. Moreover, in one of the plurality of unit circuits 115A whose extension section 142 is constituted by the capacitor forming section 134, the plurality of control transistors 135 and the output transistor 132 do not extend like the capacitor forming section 134. This makes it possible to make the pluralities of control transistors 135 and the respective output transistors 132 of the plurality of unit circuits 115A equal in configuration, thus equalizing the current characteristics and parasitic capacitances of the pluralities of control transistors 135 and the respective output transistors 132 and thereby making circuit design easy.

Further, the plurality of unit circuits 115A include a unit circuit 115A whose capacitor forming section 134 is divided into a first divided capacitor forming section 134S1 placed opposite the display area AA across the output transistor 132 and a second divided capacitor forming section 134S2 situated closer to the display area AA than the output transistor 132, whose extension section 142 is constituted by the second divided capacitor forming section 134S2 being disposed to extend farther away from the driver than the output transistor 132 and the first divided capacitor forming section 134S1. In this way, in one of the plurality of unit circuits 115A whose extension section 142 is constituted by the second divided capacitor forming section 134S2, the first divided capacitor forming section 134S1 does not extend like the second divided capacitor forming section 134S2. Note here that since the first divided capacitor forming section 134S1, which does not constitute the extension section 142, is placed opposite the display area AA across the output transistor 132, the first divided capacitor forming section 134S1 avoids exerting influence on the circuit configuration of the other unit circuits 115A by not extending like the second divided capacitor forming section 134S2. On the other hand, the second divided capacitor forming section 134S2, which constitutes the extension section 142, is situated closer to the display area AA than the output transistor 132, the second divided capacitor forming section 134S2 is placed using a space that is present closer to the display area AA than the output transistor 132 and may exert less influence on the circuit configuration of the other unit circuits 115A.

Further, the plurality of unit circuits 115A are configured such that the first divided capacitor forming section 134S1 of one of the plurality of unit circuits 115A that is situated closer to the driver is smaller than the first divided capacitor forming section 134S1 of one of the plurality of unit circuits 115A that is situated farther away from the driver and the second divided capacitor forming section 134S2 of one of the plurality of unit circuits 115A that is situated closer to the driver is larger than the second divided capacitor forming section 134S2 of one of the plurality of unit circuits 115A that is situated farther away from the driver. In this way, a unit circuit 115A situated closer to the driver is smaller in dimension in the direction of arrangement of the unit circuit 115A, the source lead wires 117, and the display area AA than a unit circuit 115A situated farther away from the driver. Accordingly, a larger space for placement of the source lead wires 117 is secured between a unit circuit 115A situated closer to the driver and the display area AA than between a unit circuit 115A situated farther away from the driver and the display area AA. This makes it harder for the source lead wires 117 to get broken or short-circuited near the driver. Further, since a unit circuit 115A situated closer to the driver has a smaller first divided capacitor forming section 134S1 and a larger second divided capacitor forming section 134S2, the capacitor forming sections 134 of the plurality of unit circuits 115A can be kept equal in area.

Embodiment 3

Embodiment 3 is described with reference to FIG. 21. Embodiment 3 illustrates changes made to Embodiment 1 described above to achieve the outer shape of the display area AA and the configuration of source lead wires 217. It should be noted that a repeated description of structures, actions, and effects which are similar to those of Embodiment 1 described above is omitted.

Figure 21:
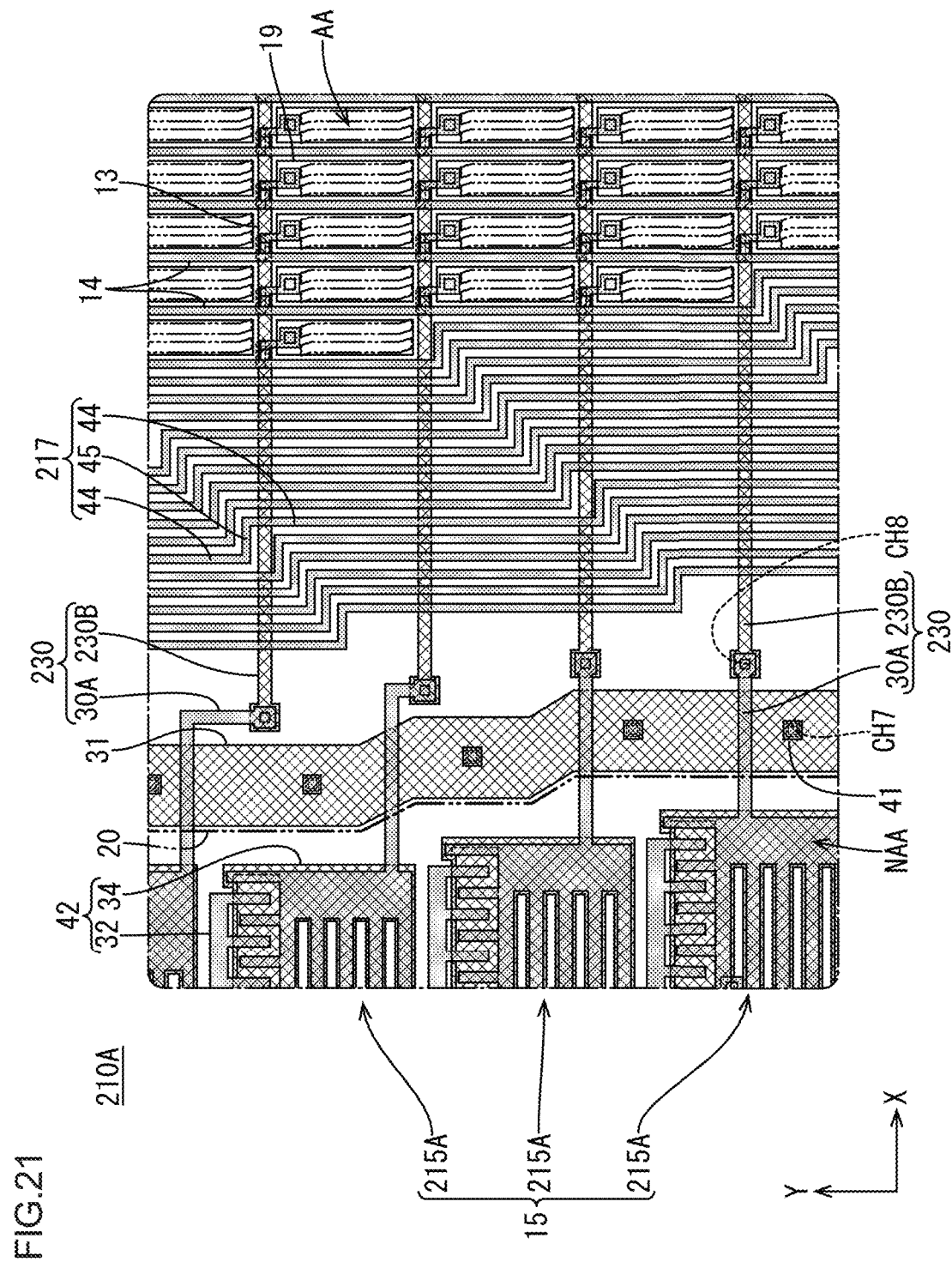
FIG. 21 is a plan view mainly showing patterns of a first metal film and a second metal film regarding a configuration of unit circuits and nearby components of a gate circuit section in and near an extended outer shape section of an array substrate according to Embodiment 3.

As shown in FIG. 21, an array substrate 210A according to the present embodiment differs in the shape of an extended outer shape section, and accordingly, the outer shape of the display area AA in and near the extended outer shape section forms into a gentler arc than that described above in Embodiment 1. In particular, the outer shape of the display area AA in and near the extended outer shape section forms a circular arc with a larger radius of curvature and forms a smaller angle with the Y-axis direction than in Embodiment 1 described above. FIG. 21 is a plan view mainly showing patterns of a first metal film and a second metal film regarding a configuration of components in and near the extended outer shape section. FIG. 21 uses different types of half-tone dot meshing to illustrate the patterns of the first metal film and the second metal film.

The plurality of source lead wires 217, which extend along the outer shape of the display area AA in and near the extended outer shape section, are routed through a path which is different from that of Embodiment 1 described above. In particular, each of the source lead wires 217, which are composed of the second metal film, includes a cross wiring section 44 that is disposed to orthogonally cross (cross) a second circuit connecting wire 230B, which is composed of the first metal film, of a circuit connecting wire 230 via a gate insulating film and a parallel wiring section 230 that is disposed to be offset from a second circuit connecting wire 230B and that runs parallel to the second circuit connecting wire 230B. Since the cross wiring section 44 orthogonally crosses the second circuit connecting wire 230B, the area of overlap with the second circuit connecting wire 230B is smaller than in a case where the cross wiring section 44 obliquely crosses the second circuit connecting wire 230B. This makes it possible to reduce a parasitic capacitance that may be formed between the source lead wire 217 and the circuit connecting wire 230. Moreover, since the parallel wiring section 45 is positionally related to the second circuit connecting wire 230B to be offset from the second circuit connecting wire 230B, a parasitic capacitance that may be formed between the source lead wire 217 and the circuit connecting wire 230 can be further reduced than in a case where a parallel wiring section is positionally related to the source lead wire 217 to overlap the source lead wire 217.

According to the present embodiment, as described above, the array substrate 210A further includes a plurality of circuit connecting wires 230, connected to the plurality of unit circuits 215A, respectively, that extend to the display area AA. Each of the source lead wires 217 includes a cross wiring section 44 that is disposed to cross the circuit connecting wires 230 via a gate insulating film and a parallel wiring section 230 that is disposed to be offset from the circuit connecting wires 230 and that runs parallel to the circuit connecting wires 230. In this way, a parasitic capacitance that may be formed between the source lead wire 217 and the circuit connecting wires 230 can be made lower than in a case where a parallel wiring section is positionally related to the source lead wire 217 to overlap the source lead wire 217, as the parallel wiring section 45 is disposed to be offset from the circuit connecting wires 230.

Other Embodiments

The technology disclosed herein is not limited to the embodiments described with reference to the foregoing description and drawings. For example, embodiments such as those listed below are encompassed in the technical scope.

(1) In each of the configurations described above in Embodiments 1 and 3, the planar shape of a slit 43 that is bored through a capacitor forming section 34 may be changed as appropriate to a vertically long square, a regular square, a V shape, or other shapes. Similarly, in the configuration described above in Embodiment 2, the planar shape of a slit 43 that is bored through a capacitor forming section 134 may be changed as appropriate to a horizontally long square, a regular square, a V shape, or other shapes. Further, the number of slits 43 that are bored through a capacitor forming section 34 or 134 may be changed as appropriate to a number other than that illustrated.

(2) The configurations described above in Embodiments 1 and 2 may be combined. Similarly, the configurations described above in Embodiments 2 and 3 may be combined.

(3) Of the circuit elements constituting a unit circuit 15A, 115A, or 215A of a gate circuit section 15, the output transistor 32 or 132 may change in dimension in the X-axis direction and the Y-axis direction according to positional relationship with the driver 11. In that case, the output transistor 32 or 132 may be included in an extension section 42 or 142, but does not need to be included in the extension section 42 or 142.

(4) The specific placement of the circuit elements (output transistor 32 or 132, capacitor forming section 34 or 134, and control transistors 35 or 135) constituting a unit circuit 15A, 115A, or 215A of a gate circuit section 15 is subject to change as appropriate.

(5) The specific number of control transistors 35 or 135 that are included in a unit circuit 15A, 115A, or 215A of a gate circuit section 15 is subject to change as appropriate.

(6) The specific type and number of circuit elements that constitute a unit circuit 15A, 115A, or 215A of a gate circuit section 15 are subject to change as appropriate. For example, the number of circuit elements may be larger than or equal to 4 and may be smaller than or equal to 2.

(7) A plurality of unit circuits 15A, 115A, or 215A constituting a gate circuit section 15 may include a unit circuit 15A, 115A, or 215A having no extension section 42 or 142. For example, in a case where the range of formation of an extended outer shape section 10EX or 110EX in the array substrate 10A, 110A, or 210A is limited and the remaining portion is rectangular, a unit circuit 15A, 115A, or 215A that is placed in the rectangular portion may be configured not to have an extension section 42 or 142.

(8) The source lead wires 17, 117, or 217 may be configured to be indirectly connected to the source lines 14 via a circuit section (such as an RGB switch circuit section) monolithically provided over the array substrate 10A, 110A, or 210A. In the configuration in which the source lead wires 17, 117, or 217 are connected to the source lines 14 via the RGB switch circuit section, the number of source lead lines 17, 117, or 217 that are provided is approximately ⅓ of the number of source lines 14 that are provided. That is, the number of source lines 14 that are provided and the number of source lead lines 17, 117, or 217 that are provided do not necessarily need to match.

(9) The seal section 10D may be constituted by a photo-curable resin material that becomes cured with light of a wavelength other than ultraviolet light such as visible light. Further, the seal section 10D may contain both a photo-curable resin material (including an ultraviolet-curable resin material) and a thermosetting resin material. In that case, the seal section 10D is subjected to both light and heat to be cured.

(10) The driver 11 may be mounted by COF (chip on film) on a flexible substrate that is mounted by FOG (film on glass) on the array substrate 10A, 110A, or 210A. In that case, the source lead wires 17, 117, or 217 are connected to terminal areas that are placed in a mounting area of the array substrate 10A, 110A, or 210A for the flexible substrate and that are connected to the flexible substrate.

(11) The outer shape of the array substrate 10A, 110A, or 210A and the outer shape of the display area AA do not need to be similar to each other.

(12) An extended outer shape section 10EX or 110EX may be provided only on one side of the array substrate 10A, 110A, or 210A in the X-axis direction. In that case, extended outer shape sections 10EX or 110EX may be provided on both sides, respectively, of the array substrate 10A, 110A, or 210A in the Y-axis direction, or an extended outer shape section 10EX or 110EX may be provided only beside the driver 11. Furthermore, extended outer shape sections 10EX or 110EX may be provided on both sides in the Y-axis direction. At this point in time, the array substrate 10A, 110A, or 210A may be circular or elliptical in shape as a whole. In any case, the planar shape of the display area AA, the arrangement of a plurality of unit circuits 15A, 115A, or 215A constituting a gate circuit section 15, the path along which the source lead wires 17, 117, or 217 are routed, and the like are changed according to a change in the outer shape of the array substrate 10A, 110A, or 210A.

(13) An extended outer shape section 10EX or 110EX in the array substrate 10A, 110A, or 210A may include an inward-retracted circular arc (curved) portion. In that case, the planar shape of the display area AA, the arrangement of a plurality of unit circuits 15A, 115A, or 215A constituting a gate circuit section 15, the path along which the source lead wires 17, 117, or 217 are routed, and the like are changed according to a change in the outer shape of the array substrate 10A, 110A, or 210A.

(14) An extended outer shape section 10EX or 110EX in the array substrate 10A, 110A, or 210A may form a linear shape, a polygonal shape, or other shapes instead of a circular arc shape. In that case, the planar shape of the display area AA, the arrangement of a plurality of unit circuits 15A, 115A, or 215A constituting a gate circuit section 15, the path along which the source lead wires 17, 117, or 217 are routed, and the like are changed according to a change in the outer shape of the array substrate 10A, 110A, or 210A.

(15) The outer shape of the array substrate 10A, 110A, or 210A in plan view may be a trapezoid, a diamond, a tringle, a polygon with five or more sides, or other shapes. Further, the array substrate 10A, 110A, or 210A may be vertically long in shape when seen in plan view. In that case, the planar shape of the display area AA, the arrangement of a plurality of unit circuits 15A, 115A, or 215A constituting a gate circuit section 15, the path along which the source lead wires 17, 117, or 217 are routed, and the like are changed according to a change in the outer shape of the array substrate 10A, 110A, or 210A.

(16) A gate circuit section 15 may be provided only on one side of the array substrate 10A, 110A, or 210A.

(17) The spacings at which a plurality of unit circuits 15A, 115A, or 215A included in a gate circuit section 15 are arrayed, the spacings at which gate lines 13 (pixel electrodes 19) are arrayed, the number of gate lines 13 (pixel electrodes 19) that are provided, and the like are subject to change as appropriate.

(18) The specific planar shapes and number of pixel electrode overlap openings 20A provided in the common electrode 20 are subject to change as appropriate.

(19) The pixel electrode overlap openings 20A provided in the common electrode 20 may be omitted and replaced by openings formed in the pixel electrode 19.

(20) The pixel electrode 19 may be constituted by the second transparent electrode film 29, and the common electrode 20 may be constituted by the first transparent electrode film 27.

(21) The display mode of the liquid crystal panel 10 may be a TN mode, a VA mode, an IPS mode, or other modes instead of being an FFS mode. In a case where the display mode of the liquid crystal panel 10 is a TN mode or a VA mode, an auxiliary capacitor line is provided instead of the common line 31 or 131 as a constant-potential line.

(22) The liquid crystal panel 10 may be of a reflective type or a semitransmissive type instead of being of a transmissive type.

(23) The semiconductor film 23 may be composed of amorphous silicon or polysilicon (LTPS).

(24) The liquid crystal panel 10 may be replaced by another type of display panel (such as an organic EL (electroluminescence) display panel).

What is claimed is:

1. A substrate for a display device, the substrate comprising:
    a signal supply section that supplies a signal;
    a substrate section having an extended outer shape section whose width is extended with distance from the signal supply section and having a display area configured to display an image by utilizing the signal that is supplied by the signal supply section;
    a plurality of lead wires, connected to the signal supply section, that extend along the extended outer shape section to the display area; and
    a circuit section that is placed so that the lead wires are interposed between the display area and the circuit section and that is composed of a plurality of unit circuits arranged along the extended outer shape section, wherein
    the plurality of unit circuits include a unit circuit having an extension section that extends away from the signal supply section so as to be interposed between a unit circuit that is adjacent to the unit circuit on a side opposite to the signal supply section and the lead wires, and
    the plurality of unit circuits are configured such that one of the plurality of unit circuits that is situated closer to the signal supply section is larger in extension dimension of the extension section than one of the plurality of unit circuits that is situated farther away from the signal supply section.

2. The substrate according to claim 1, further comprising a plurality of circuit connecting wires, connected to the plurality of unit circuits, respectively, that extend to the display area,
    wherein
    each of the unit circuits includes an output transistor that outputs a signal to a corresponding one of the circuit connecting wires, a capacitor forming section that is connected to a gate electrode and a drain electrode that constitute the output transistor, and a plurality of control transistors placed opposite the display area across the output transistor and the capacitor forming section, and
    the plurality of unit circuits include a unit circuit whose extension section is constituted by an output transistor and a capacitor forming section that are disposed to extend farther away from the signal supply section than the plurality of control transistors.

3. The substrate according to claim 2, wherein
    the plurality of unit circuits include a first unit circuit whose extension section is constituted by an output transistor and a capacitor forming section that are arranged along a direction of arrangement of the unit circuit, the lead wires, and the display area and a second unit circuit whose extension section is constituted by an output transistor and a capacitor forming section that are arranged along a cross direction crossing the direction of arrangement, and
    the second unit circuit is situated closer to the signal supply section than the first unit circuit.

4. The substrate according to claim 3, wherein the output transistors of the first and second unit circuits share common structures.

5. The substrate according to claim 3, wherein the capacitor forming section of the second unit circuit of the first and second unit circuits has a slit, selectively bored therethrough, through which light is transmitted.

6. The substrate according to claim 1, further comprising a plurality of circuit connecting wires, connected to the plurality of unit circuits, respectively, that extend to the display area,
    wherein
    each of the unit circuits includes an output transistor that outputs a signal to a corresponding one of the circuit connecting wires, a capacitor forming section that is connected to a gate electrode and a drain electrode that constitute the output transistor, and a plurality of control transistor placed opposite the display area across the output transistor and the capacitor forming section, and
    the plurality of unit circuits include a unit circuit whose extension section is constituted by a capacitor forming section that is disposed to extend farther away from the signal supply section than the plurality of control transistors and the output transistor.

7. The substrate according to claim 1, further comprising a constant-potential line, interposed between the plurality of unit circuits and the plurality of lead wires, that extends along the extended outer shape section.

8. The substrate according to claim 7, further comprising a plurality of circuit connecting wires, connected to the plurality of unit circuits, respectively, that extend to the display area,
    wherein each of the circuit connecting wires includes a first circuit connecting wire placed at the same layer as the lead wires and disposed to cross the constant-potential line via an insulating film and a second connecting wire, placed at the same layer as the constant-potential line and disposed to cross the lead wires via the insulating film, that is connected to the first circuit connecting wire through a contact hole bored through the insulating film sandwiched between the first circuit connecting wire and the second circuit connecting wire.

9. The substrate according to claim 1, further comprising a plurality of circuit connecting wires, connected to the plurality of unit circuits, respectively, that extend to the display area,
wherein each of the lead wires includes a cross wiring section that is disposed to cross the circuit connecting wires via an insulating film and a parallel wiring section that is disposed to be offset from the circuit connecting wires and that runs parallel to the circuit connecting wires.

10. A display device comprising:
the substrate according to claim 1; and
a counter substrate placed opposite the substrate.

11. A substrate for a display device, the substrate comprising:
a signal supply section that supplies a signal;
a substrate section having an extended outer shape section whose width is extended with distance from the signal supply section and having a display area configured to display an image by utilizing the signal that is supplied by the signal supply section;
a plurality of lead wires, connected to the signal supply section, that extend along the extended outer shape section to the display area;
a circuit section that is placed so that the lead wires are interposed between the display area and the circuit section and that is composed of a plurality of unit circuits arranged along the extended outer shape section; and
a plurality of circuit connecting wires, connected to the plurality of unit circuits, respectively, that extend to the display area, wherein
the plurality of unit circuits include a unit circuit having an extension section that extends away from the signal supply section so as to be interposed between a unit circuit that is adjacent to the unit circuit on a side opposite to the signal supply section and the lead wires,
each of the unit circuits includes an output transistor that outputs a signal to a corresponding one of the circuit connecting wires, a capacitor forming section that is connected to a gate electrode and a drain electrode that constitute the output transistor, and a plurality of control transistors placed opposite the display area across the output transistor and the capacitor forming section,
the plurality of unit circuits include a unit circuit whose extension section is constituted by an output transistor and a capacitor forming section that are disposed to extend farther away from the signal supply section than the plurality of control transistors,
the plurality of unit circuits include a first unit circuit whose extension section is constituted by an output transistor and a capacitor forming section that are arranged along a direction of arrangement of the unit circuit, the lead wires, and the display area and a second unit circuit whose extension section is constituted by an output transistor and a capacitor forming section that are arranged along a cross direction crossing the direction of arrangement,
the second unit circuit is situated closer to the signal supply section than the first unit circuit,
the plurality of unit circuits include a third unit circuit whose capacitor forming section is configured to be composed of a first capacitor forming section placed adjacent to the output transistor in the direction of arrangement and a second capacitor forming section placed adjacent to the output transistor in the cross direction, and
the third unit circuit is situated closer to the signal supply section than the first unit circuit and farther away from the signal supply section than the second unit circuit.

12. The substrate according to claim 11, wherein the third unit circuit has a slit, selectively bored through the second capacitor forming section of the first and second capacitor forming sections constituting the capacitor forming section, through which light is transmitted.

13. The substrate according to claim 11, wherein the capacitor forming section of the second unit circuit of the first and second unit circuits has a slit, selectively bored therethrough, through which light is transmitted.

14. A substrate for a display device, the substrate comprising:
a signal supply section that supplies a signal;
a substrate section having an extended outer shape section whose width is extended with distance from the signal supply section and having a display area configured to display an image by utilizing the signal that is supplied by the signal supply section;
a plurality of lead wires, connected to the signal supply section, that extend along the extended outer shape section to the display area;
a circuit section that is placed so that the lead wires are interposed between the display area and the circuit section and that is composed of a plurality of unit circuits arranged along the extended outer shape section; and
a plurality of circuit connecting wires, connected to the plurality of unit circuits, respectively, that extend to the display area, wherein
the plurality of unit circuits include a unit circuit having an extension section that extends away from the signal supply section so as to be interposed between a unit circuit that is adjacent to the unit circuit on a side opposite to the signal supply section and the lead wires,
each of the unit circuits includes an output transistor that outputs a signal to a corresponding one of the circuit connecting wires, a capacitor forming section that is connected to a gate electrode and a drain electrode that constitute the output transistor, and a plurality of control transistors placed opposite the display area across the output transistor and the capacitor forming section,
the plurality of unit circuits include a unit circuit whose extension section is constituted by a capacitor forming section that is disposed to extend farther away from the signal supply section than the plurality of control transistors and the output transistor, and
the plurality of unit circuits include a unit circuit whose capacitor forming section is divided into a first divided capacitor forming section placed opposite the display area across the output transistor and a second divided capacitor forming section situated closer to the display area than the output transistor, whose extension section is constituted by the second divided capacitor forming section being disposed to extend farther away from the signal supply section than the output transistor and the first divided capacitor forming section.

15. The substrate according to claim 14, wherein the plurality of unit circuits are configured such that the first divided capacitor forming section of one of the plurality of unit circuits that is situated closer to the signal supply section is smaller than the first divided capacitor forming section of one of the plurality of unit circuits that is situated farther away from the signal supply section and the second divided capacitor forming section of one of the plurality of unit circuits that is situated closer to the signal supply section is larger than the second divided capacitor forming section of one of the plurality of unit circuits that is situated farther away from the signal supply section.

\* \* \* \* \*